(12) United States Patent
Mizuno

(10) Patent No.: US 8,956,512 B2
(45) Date of Patent: Feb. 17, 2015

(54) MAGNETRON SPUTTERING APPARATUS AND FILM FORMING METHOD

(71) Applicant: Tokyo Electron Limited, Tokyo (JP)

(72) Inventor: Shigeru Mizuno, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 233 days.

(21) Appl. No.: 13/745,013

(22) Filed: Jan. 18, 2013

(65) Prior Publication Data

US 2013/0186743 A1 Jul. 25, 2013

(30) Foreign Application Priority Data

Jan. 19, 2012 (JP) ................................ 2012-009218

(51) Int. Cl.
| | |
|---|---|
| C23C 14/35 | (2006.01) |
| C23C 14/00 | (2006.01) |
| C23C 14/06 | (2006.01) |
| C23C 14/34 | (2006.01) |
| H01J 37/34 | (2006.01) |

(52) U.S. Cl.
CPC ............. *C23C 14/35* (2013.01); *C23C 14/0036* (2013.01); *C23C 14/0641* (2013.01); *C23C 14/345* (2013.01); *H01J 37/3408* (2013.01); *H01J 37/3452* (2013.01); *H01J 37/3455* (2013.01)
USPC ............ 204/192.12; 204/192.15; 204/192.17; 204/298.2; 204/298.19

(58) Field of Classification Search
USPC ............... 204/298.2, 298.19, 192.12, 192.15, 204/192.17
See application file for complete search history.

(56) References Cited

FOREIGN PATENT DOCUMENTS

| | | |
|---|---|---|
| JP | 9-118979 | 5/1997 |
| JP | 2000-309867 | 11/2000 |
| JP | 2004-162138 | 6/2004 |

*Primary Examiner* — Rodney McDonald
(74) *Attorney, Agent, or Firm* — Oblon, Spivak, McClelland, Maier & Neustadt, L.L.P.

(57) ABSTRACT

A target is provided opposite to a wafer mounted on in a vacuum chamber, and a magnet array body is disposed above the target. In the magnet array body, ring-shaped magnet arrays are arranged to generate annular magnetic fields in the circumferential direction of the wafer, and a sputtering film formation is performed by switching between the magnetic fields.

12 Claims, 29 Drawing Sheets

— FILM FORMATION AMOUNT CAUSED BY P1
---- FILM FORMATION AMOUNT CAUSED BY P2
—-— FILM FORMATION AMOUNT CAUSED BY P3
—--— FILM FORMATION AMOUNT CAUSED BY P4
— FILM FORMATION AMOUNT CAUSED BY P1 TO P4

——— FILM FORMATION AMOUNT CAUSED BY P1
----- FILM FORMATION AMOUNT CAUSED BY P2
—·— FILM FORMATION AMOUNT CAUSED BY P3
—··— FILM FORMATION AMOUNT CAUSED BY P4
▬▬▬ FILM FORMATION AMOUNT CAUSED BY P1 TO P4

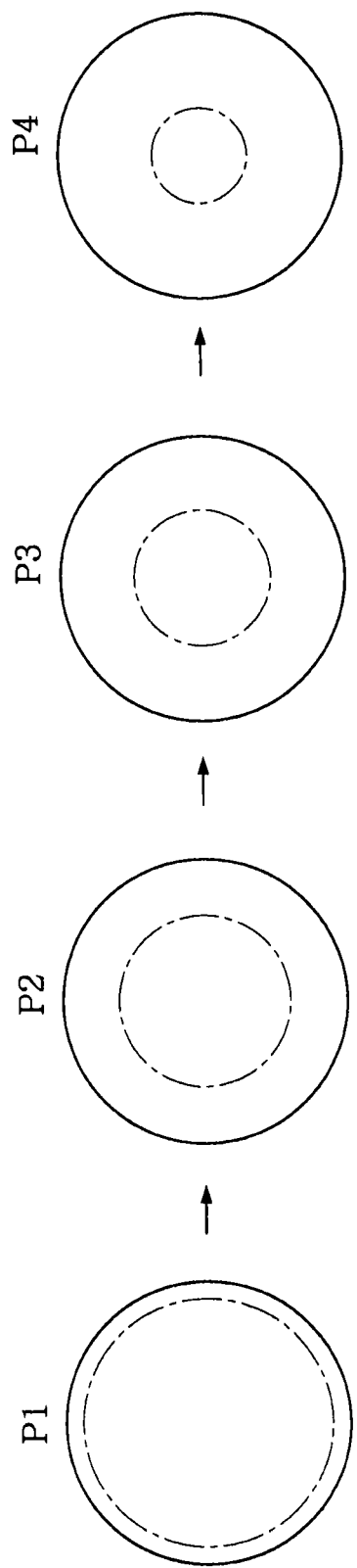

P0

P1

P2

P3

P4

MAGNETRON SPUTTERING APPARATUS AND FILM FORMING METHOD

CROSS-REFERENCE TO RELATED APPLICATIONS

This application claims priority to Japanese Patent Application No. 2012-009218 filed on Jan. 19, 2012, the entire contents of which are incorporated herein by reference.

FIELD OF THE INVENTION

The present invention relates to a magnetron sputtering apparatus for forming a thin film on a substrate using a magnetic field and a film forming method thereof.

BACKGROUND OF THE INVENTION

There has been known a reactive sputtering device using magnetic fields to form, for example, a titanium nitride film on a substrate to be processed, such as a semiconductor wafer (Hereinafter, referred to as "wafer").

In this device, by applying a negative DC voltage to a target made of, e.g., titanium and disposed opposite to a wafer, a magnetic field is formed between the target and the wafer by a magnet member provided above the target. If, for example, a processing gas, containing nitrogen gas and argon gas for plasma generation, is supplied to the processing space between the target and the wafer, the target is sputtered by the argon ions while the nitrogen gas is activated, and a titanium nitride film is formed on the wafer.

Specifically, when the concentration of nitrogen gas is relatively low inside the vacuum chamber, the titanium particles (atoms or molecules) are piled down on top of the wafer by the sputtering of the target and then, the titanium particles are nitrided on the wafer by the active species (ions and radicals) of nitrogen gas. Contrarily, when the concentration of nitrogen gas is relatively high inside the vacuum chamber, the surface of the target is nitrided by the active species of nitrogen gas to thereby form a titanium nitride film (layer) which is then sputtered to be deposited on the wafer.

In the case when the target is nitrided (when the concentration of nitrogen gas is relatively high), in comparison to when the concentration of nitrogen gas is relatively low, the electrical resistance becomes large, and thus the negative DC voltage is set to a greater value. Also, at the periphery of the wafer, particles scatter from the target to the periphery of the wafer. Further, since the film thickness gets thinner at the center of the wafer, a high plasma intensity (magnetic field) is set at the center of the wafer in order to compensate for the scattering amount (in order to obtain an in-plane uniform thickness of thin film). In order to obtain the in-plane uniformity of the plasma process, the magnet member, for example, is configured to eccentrically rotate around a vertical axis extending through the center of the wafer.

At this time, the target is provided opposite to the wafer, and thus the processing gas, for example, is supplied from of a side of the processing space in order to suppress the processing gas supply path from interfering with the wafer and the target. Accordingly, the nitrogen gas is more easily consumed at the outer circumference side of the wafer because the plasma intensity is set more strongly at the outer circumference side than at the center of the wafer. In other words, at the processing space, as it becomes easier to generate a non-uniformity in concentration of the active species of nitrogen gas in a radial direction of the wafer, the thin film composition (the ratio of nitrogen contained in the thin film) in the radial direction of the wafer becomes non-uniform, and thus it is difficult to obtain a good yield ratio for chips that are cut out from the wafer.

In the meantime, if the plasma intensity is adjusted to obtain the in-plane uniform composition of thin film, it is difficult to obtain the uniformity of the film thickness. Therefore, it is difficult to simultaneously obtain an in-plane uniform thickness and composition of thin film by using a reactive sputtering device. Also, if the film formation is performed in a narrow gap between the target and the wafer by reducing the gap therebetween in order, for example, to obtain a good film forming rate and a high use efficiency of the target (the ratio of the amount of titanium deposited on the wafer to the amount of the target), it becomes particularly difficult to obtain uniform film thickness and composition.

If the concentration non-uniformity of nitrogen gas forms in the radial direction of the wafer, the center and the periphery of the wafer may diverge away during the titanium nitride film forming process. Specifically, at the center of the wafer, the titanium particles caused by the sputtering of the target and then deposited on the wafer may be nitrided, but, at the periphery of the wafer, particles caused by the sputtering of the nitrided target are deposited on the wafer. In this case, for example, the appropriately applied DC voltage value becomes non-uniform within the surface of the target, so that it becomes difficult to obtain the plasma intensity as initially set.

Therefore, in conventional devices, the distance between the target and the wafer is greatly increased in order to obtain a wider diffusion space of nitrogen gas, or the pressure of the nitrogen gas in the vacuum chamber is set as low as possible in order for the nitrogen gas to spread more quickly. As a result, in the method of using the wider diffusion space, it is difficult to perform film formation within the narrow gap. Also, in the method of setting a low pressure of nitrogen gas in the vacuum chamber, the available pressure conditions for performing film formation becomes limited. In the case where the film formation is performed within the narrow gap, the space in which the nitride gas is scattered is limited and therefore, it is difficult to obtain a good rate of diffusion.

The technique for performing a film formation on a wafer is described in Japanese Patent Applications Publication Nos. 2004-162138, 2000-309867, and 9-118979, but the above-described problem is not dealt with therein.

SUMMARY OF THE INVENTION

In view of the above, the present invention provides a magnetron sputtering apparatus and a film forming method capable of forming a thin film with high in-plane uniformity in relation to film thickness of the thin film.

In accordance with an aspect of the present invention, there is provided a magnetron sputtering apparatus in which a target is disposed opposite to a substrate to be processed mounted in a vacuum chamber and magnet members are disposed on a back surface of the target. The apparatus includes power supply unit configured to apply a voltage to the target; a plurality of magnetic pole array sets, each of which includes an outer ring-shaped magnetic pole array formed of magnetic poles arranged in a circumferential direction of the substrate and an inner ring-shaped magnetic pole array formed of magnetic poles arranged in the circumferential direction of the substrate inwardly of the outer ring-shaped magnetic pole array, arranged concentrically with each other, each of the magnetic pole array sets serving to generate a cusp magnetic field between the outer and the inner ring-shaped magnetic pole array and allow electrons to drift in the circumferential direction of the substrate; an operating unit configured to move the inner and/or the outer ring-shaped magnetic pole array of each of the magnetic pole array sets to temporally switch the magnetic pole array set which generates the cusp magnetic field; and a rotation unit configured to rotate the magnetic pole array sets along the circumferential direction of the substrate.

The magnetron sputtering apparatus may have the following configurations.

In a configuration, the gas supply path is provided in a processing space between the target and the substrate to supply a reactant gas for generating active species that reacts with the target and a plasma generating gas that is needed to activate the reactant gas, and/or a distance between the target and the substrate is set to 30 mm or lower during a film forming process.

In a configuration, the magnetic poles of the inner ring-shaped magnetic pole array of one of the magnetic pole array sets also serves as the magnetic poles of the outer ring-shaped magnetic pole array of the magnetic pole array set inwardly adjacent thereto, the corresponding magnetic poles are formed of N-pole and/or S-pole arranged side by side on each of the magnet members arranged along the circumferential direction of the substrate, each of the magnet members being independently arranged to be rotatable about an axis perpendicular to the substrate, and the operating unit changes the orientation of each of the magnet members to temporally switch the magnetic pole array set which generates the cusp magnetic field between the corresponding magnetic pole array sets.

In a configuration, the operating unit serves to rotate at least one of the outer and the inner ring-shaped magnetic pole array around an axis extending through the center of the corresponding ring-shaped magnetic pole array, the magnetic poles of the inner ring-shaped magnetic pole array of one of the magnetic pole array sets also serves as the magnetic poles of the outer ring-shaped magnetic pole array of the magnetic pole array set inwardly adjacent thereto, a power that is supplied from the power supply unit to the target is set to be smaller in a case where the magnetic pole array set arranged at an inner side generates the cusp magnetic field than in a case where the magnetic pole array set arranged at an outer side generates the cusp magnetic field to obtain an in-plane uniform composition of a thin film formed on the substrate by the sputtering of the target, the magnetic pole array sets generating the cusp magnetic field, and/or a time period for which a power is applied to the target is controlled individually for each of the magnetic pole array sets to obtain an in-plane uniform thickness of a thin film formed on the substrate by the sputtering of the target.

In accordance with another aspect of the present invention, there is provided a method for performing a sputtering film forming process on a substrate to be processed by using the magnetron sputtering apparatus. The method includes applying a voltage from a power supply unit to the substrate; and performing a film forming process on the substrate by the sputtering of the target by generating a cusp magnetic field by the magnetic pole array set in such a way that electrons drift in a circumferential direction of the substrate, wherein the performing a film forming process includes generating an annular cusp magnetic field in the circumferential direction of the substrate at one of a peripheral portion and a central portion of the substrate; and then generating an annular cusp magnetic field in the circumferential direction of the substrate at the other of a peripheral portion and a central portion of the substrate.

In a configuration, the performing a film forming process includes supplying a reactant gas for generating active species that reacts with the target and a plasma generating gas that is needed to activate the reactant gas to the processing space between the target and the substrate, and/or the performing a film forming process includes setting a distance between the target and the substrate to 30 mm or lower.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

First Embodiment

A magnetron sputtering apparatus in accordance with a first embodiment of the present invention will be described with reference to FIGS. 1 to 16 which form a part hereof.

Figure 1:
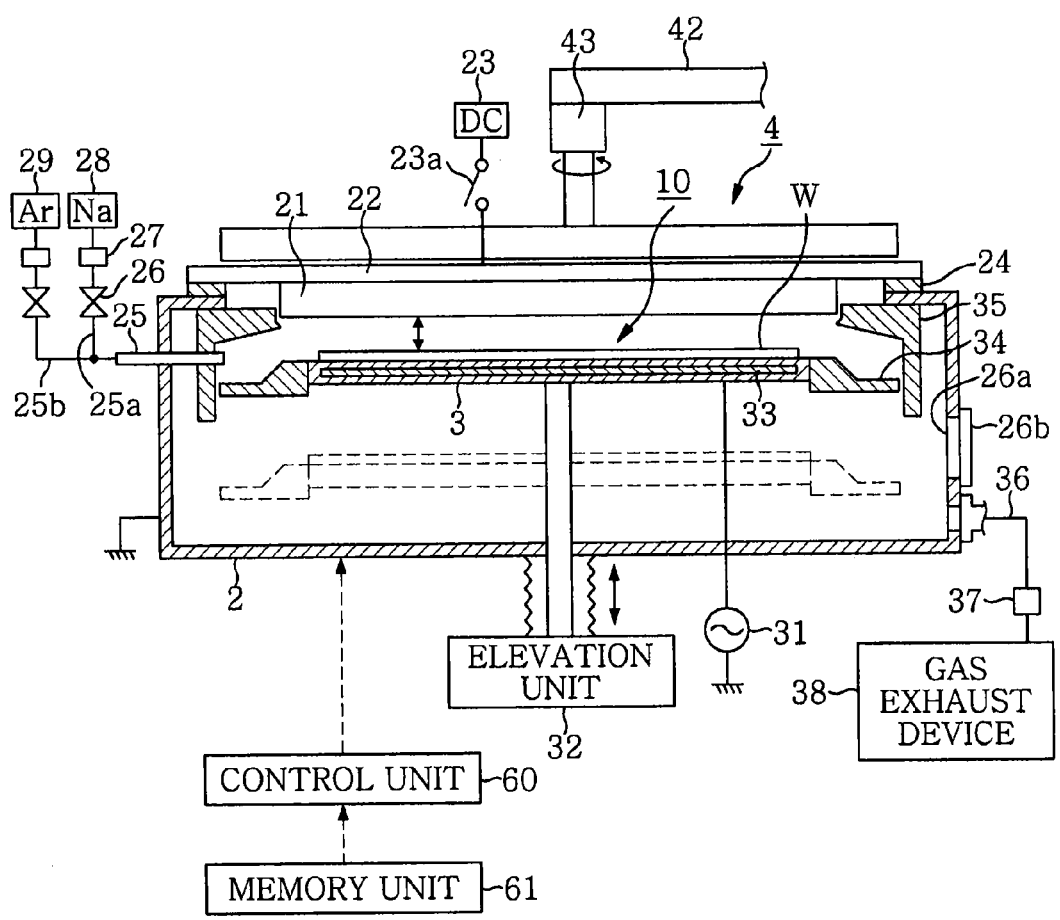
FIG. 1 is a longitudinal cross-sectional view of a magnetron sputtering apparatus in accordance with a first and a second embodiment of the present invention.
Figure 12A:
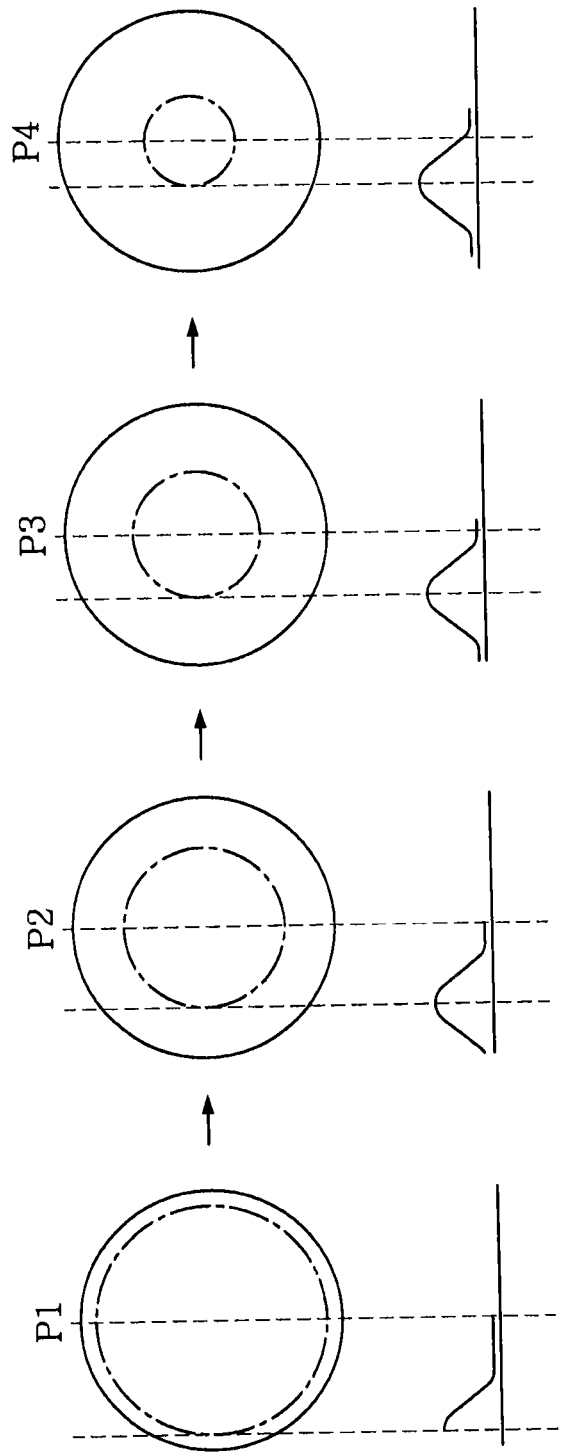
FIGS. 12A to 16 explain a thin film forming method of the magnetron sputtering apparatus.
Figure 12B:
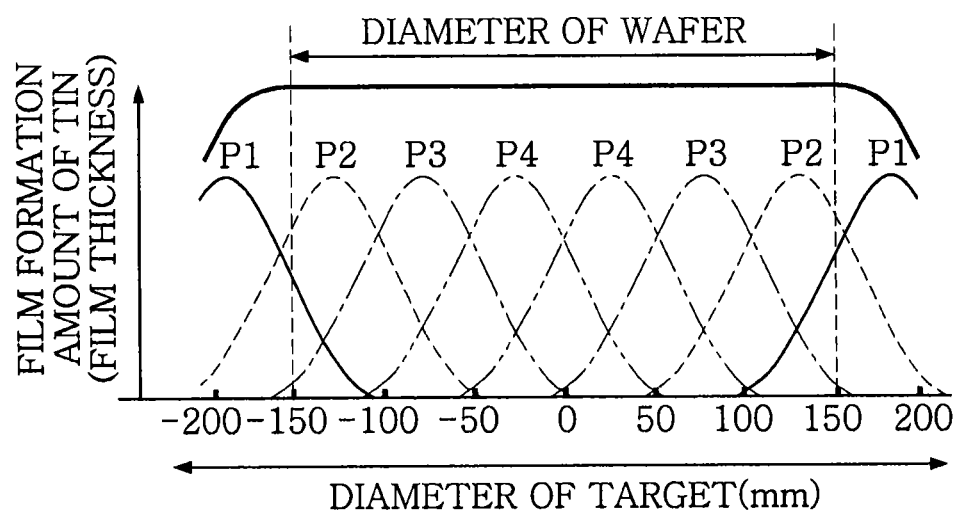

First to provide an overview explanation of the magnetron sputtering apparatus, as shown in FIG. 1, this apparatus includes a vacuum chamber 2 for accommodating a wafer w therein; and a target 21, made of e.g. titanium (Ti) or the like, which is provided on the upper side of the vacuum chamber 2. The magnetron sputtering apparatus serves to facilitate the sputtering of the target 21 by a magnetron discharge, which is generated by a magnetic field (cusp magnetic field 100) and an electric field. Also, as shown in FIGS. 12A and 12B of which will be described later in greater detail, by sequentially switching between positions P1 to P4 where a magnetic field is generated at the central and outer periphery sides of the wafer w, it is possible to obtain an in-plane uniform film thickness and film quality of a thin film formed on the wafer W by the sputtering of the target 21. The entire configuration of this magnetron sputtering apparatus will be described below.

The vacuum chamber 2 has a substantially cylindrical shaped opening formed on a ceiling portion thereof. Also, on the ceiling portion, the target 21 is provided opposite to a mounting table 3, whose diametrical dimension ranges from about, for example, 400 to 450 mm, for mounting thereon a wafer w whose diametrical dimension is about, for example, 300 mm, the target 21 having, e.g., a disc shape. The upper side of the target 21 is fixed to a provided base plate 22, and the periphery of a bottom surface of the base plate 22 is supported by the periphery of a top surface of the vacuum chamber 2, thus making it airtight.

The base plate 22, which is made of, e.g., copper (Cu), aluminum (Al), or the like is connected to a power supply unit 23 via a switch 23a, the power supply unit 23 serving to supply a negative DC voltage. As shown in FIG. 1, reference numeral "24" indicates an insulating member provided between the base plate 22 and the vacuum chamber 2 to extend in a circumferential direction of the vacuum chamber 2, and reference numerals "26a" and "26b" represent a transfer port and a gate valve, respectively.

The mounting table 3 serves as a facing electrode made of, e.g., aluminum or the like, and is connected to a high frequency power supply unit 31 for supplying a high frequency power to the mounting table 3. The mounting table 3 is configured to freely move vertically by an elevation unit 32, located below the vacuum chamber 2, between a processing (sputtering) position and a transfer position, where a wafer w loads into and unloads from the vacuum chamber 2. At the processing position, a distance "h" between the wafer w and the target 21 is set in a range from, e.g., about 10 mm to 30 mm. A heater 33 is installed inside the mounting table 3, to heat the wafer w to e.g., about 400° C. Also provided in the mounting table 3 is an electrostatic chuck (not shown) for electrostatically attracting the wafer W. On the floor of the vacuum chamber 2, there is provided elevation pins (not shown) that are downwardly protractible and retractable by which the wafer w is transferred between the mounting table 3 and a transfer arm (not shown) through the transfer port 26a.

There is provided a member around a processing space, between the target 21 and the wafer w on the mounting table 3, to prevent particles caused by the sputtering of the target 21 from scattering to an inner wall of the vacuum chamber 2. Specifically, on the outer peripheral side of the mounting table 3, a ring-shaped holder shield 34 made of, e.g., aluminum or the like, is free to move vertically with the mounting table 3, and on the ceiling surface of the vacuum chamber 2 at the outer peripheral side of the target 21, a ring-shaped shield member 35 is provided to surround the processing space.

In the processing space, there is provided a gas supply line 25 having one open end extending through the ring-shaped holder member 35 and the sidewall of the vacuum chamber 2, and the other end branching off into a reactant gas supply line 25a and a plasma-generating supply line 25b. The gas supply lines 25a and 25b are respectively each connected to a reactant gas (nitrogen ($N_2$)) reservoir 28 and a plasma-generating gas (argon (Ar)) reservoir 29, via a valve 26 and a flow rate adjusting unit 27. Opposite ends of a gas exhaust line 36 through which the inner atmosphere of the vacuum chamber 2 is vacuum-exhausted are respectively connected to the sidewall of the vacuum chamber 2 close to the floor thereof and a vacuum exhaust device 38 including a vacuum pump and the like via a butterfly valve 37.

Figure 2:
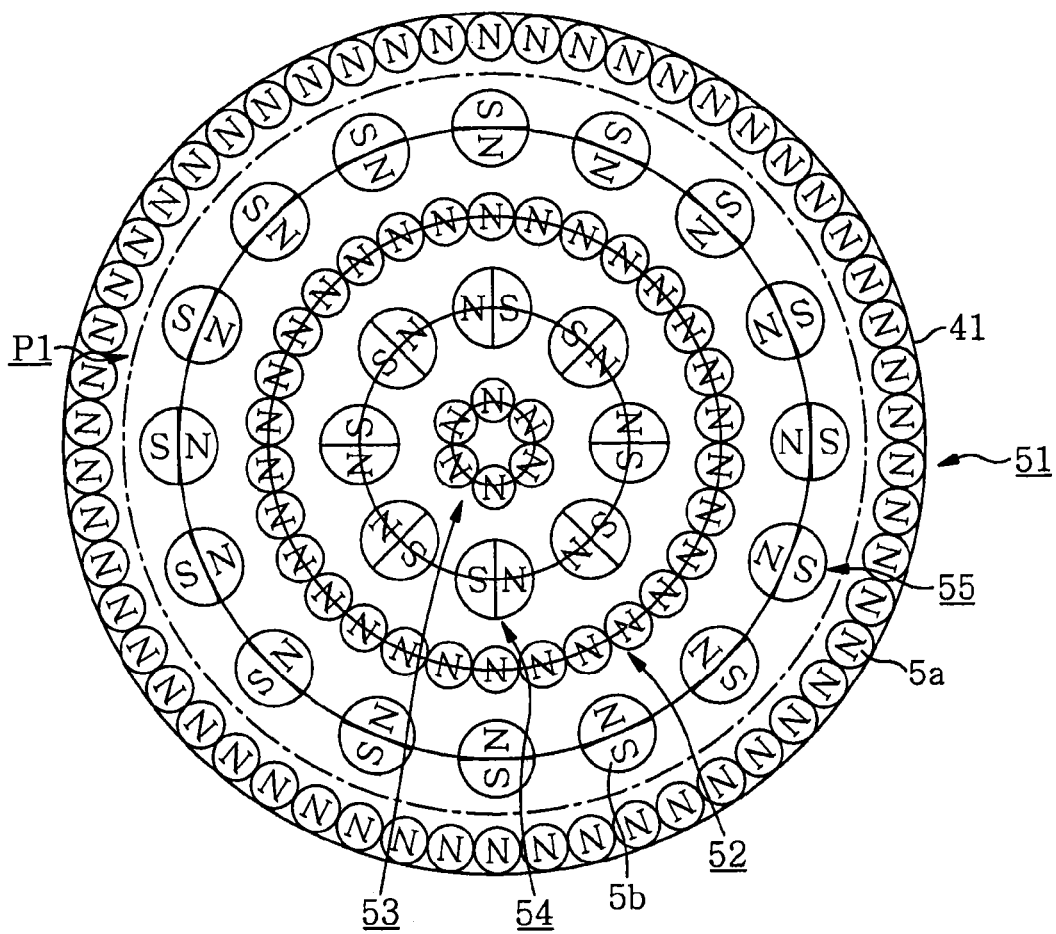
FIG. 2 is a plan view of a first configuration of a magnet array body included in the magnetron sputtering apparatus in accordance with the first embodiment.
Figure 3:
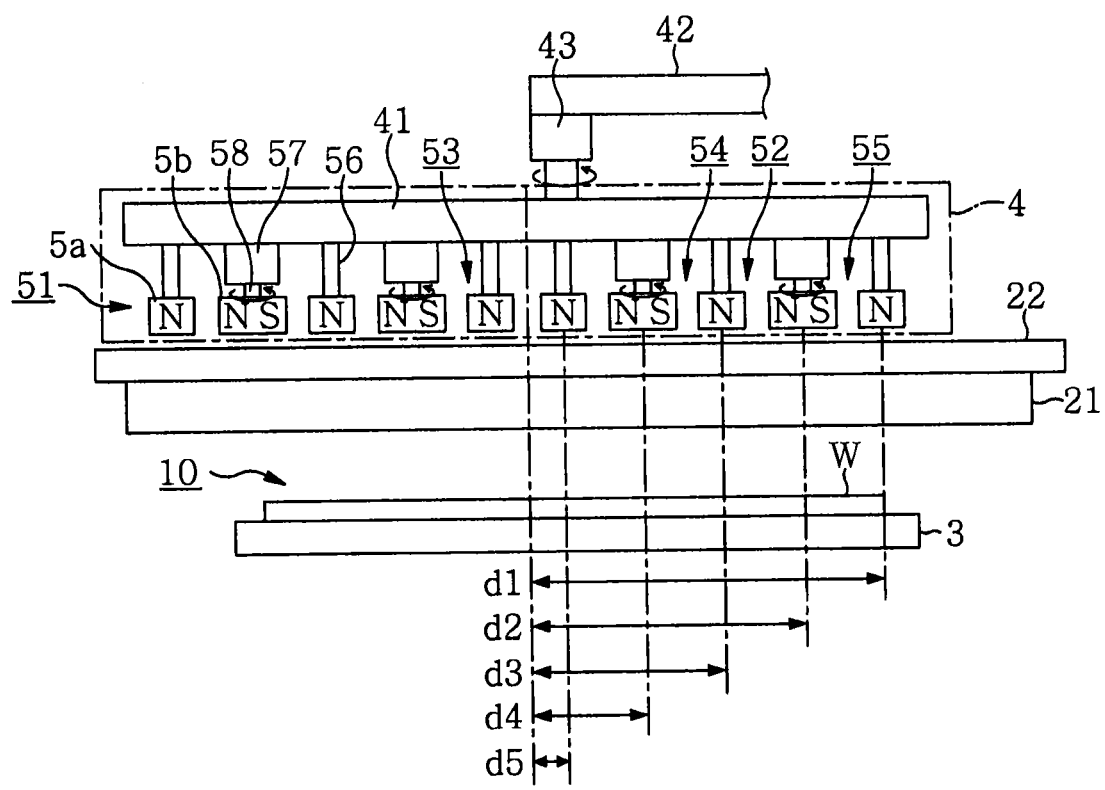
FIG. 3 is a side view of the magnet array body.

A magnet array body 4 for generating the cusp magnetic field 100 inside the vacuum chamber 2 will now be described. As shown in FIGS. 2 and 3, the magnet array body 4 includes permanent magnet members 5 arranged in multiple points on a bottom surface of a disc-shaped rotation plate 41, the magnet members 5 having magnetic flux density ranging from, for example, about 100 to 300 G. At a position slightly above (e.g., about 2 to 5 mm) from the base plate 22 of the target 21 above the vacuum chamber 2, the magnet array body is rotatably supported around a vertical axis (perpendicularly extending from the wafer W) by a rotation unit 43 including a motor and the like provided on a supporting member 42.

Figure 4:
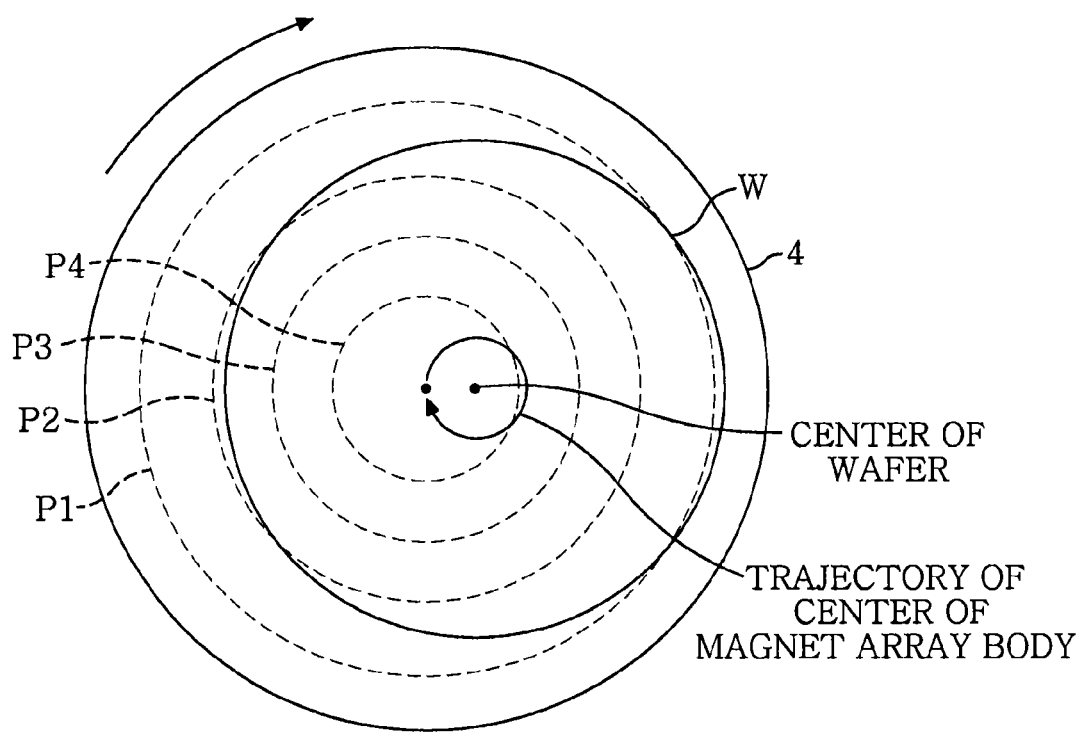
FIG. 4 is a schematic plan view showing an example of an eccentric rotation of the magnet array body.

The position of the rotation unit 43 may be adjusted in such a way that the rotation unit 43 is located at a position which is offset from a position corresponding to the center of the wafer W by a distance of e.g., about 0 to 30 mm, and the rotation unit 43 is connected to the magnet array body 4 at a position which is offset from the center of the magnet array body 4 by a distance of, e.g., about 10 to 30 mm. Therefore, as shown in FIG. 4, the magnet array body 4 is configured to eccentrically rotate around the vertical axis extending through the center of the wafer W mounted on the mounting table 3. Further, a cooling jacket (not shown) is provided in the vicinity of the magnet array body 4 to cool the magnet array body 4 and the target 21. FIG. 4 shows the schematic representation of the magnetic array body 4.

The arrangement layout of the magnet members 5 will now be described. Henceforth, when describing the magnetic poles (S pole and N pole) of the magnet members 5, they will be referring to magnetic poles close to the wafer w (target 21), and any explanations and illustrations of magnetic poles of portions close to the rotation plate 41 and away from the wafer W (target 21) will be omitted. As shown in FIGS. 2 and 3 for example, the magnet members 5 include substantially disc-shaped N pole members 5a having, e.g., an N pole and substantially disc-shaped bipolar members 5b each of which has an N pole and an S pole at opposite ends thereof in a plan view.

Figure 5:
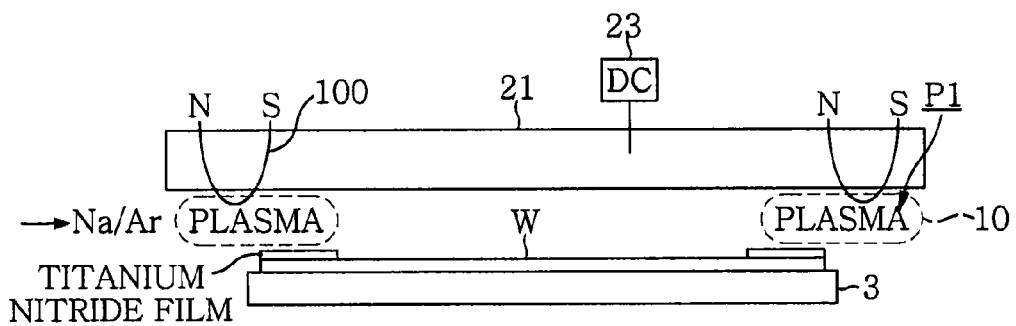
FIG. 5 is a side view showing a first step of a film forming process of the magnetron sputtering apparatus.

As schematically illustrated in FIG. 5, the N pole members 5a and the bipolar members 5b are arranged in such a way as to generate cusp magnetic field 100s along a circumferential direction of the rotation plate 41 within the vacuum chamber 20. The cusp magnetic field 100 is generated when N and S poles are arranged opposite to each other. Thus, as will be described later, the electrons generated from argon gas drift along the bottom vertices in the circumferential direction, which contributes to the formation of the ring-shaped plasma region 10. When seen in a plan view, the diametrical dimensions of each of the N pole members 5a and the bipolar members 5b are set to about e.g., 15 mm and 30 mm, respectively.

Specifically, the N pole members 5a are arranged at multiple points in a pattern of multiple concentric rings along the circumferential direction of the rotation plate 41 at the outer peripheral side, the inner side and the central side of the rotation plate 41. Here, the N pole members 5a are arranged in the pattern of multiple concentric rings and, in a direction from the outer side towards the inner side, referred to as: a first main ring-shaped magnet array 51, a second main ring-shaped magnet array 52, and a third main ring-shaped magnet array 53. Further, the bipolar members 5b are arranged in between the first main ring-shaped magnet array 51 and the second main ring-shaped magnet array 52 at multiple points in the circumferential direction and referred to as a first auxiliary ring-shaped magnet array 55. Additionally, the bipolar members 5b are arranged at multiple points in between the second main ring-shaped magnet array 52 and the third main ring-shaped magnet array 53 and referred to as a second auxiliary ring-shaped magnet array 54.

As shown in FIG. 3, the first main ring-shaped magnet array 51, the first auxiliary ring-shaped magnet array 55, the second main ring-shaped magnet array 52, the second auxiliary ring-shaped magnet array 54 and the third main ring-shaped magnet array 53 are arranged in such a way that the distances d1 to d5 from the center of the rotation plate 41 to vertical lines extending through the centers of the magnet members 5 included in each of the ring-shaped magnet arrays 51, 55, 52, 54 and 53 are respectively set to, for example, 15 mm, 46 mm, 86 mm, 146 mm, and 189 mm. Further, the numbers of the magnet members 5 included in the ring-shaped magnet arrays 51, 55, 52, 54 and 53 are respectively set to, e.g., 6, 8, 30, 16, and 54.

The first and the third main ring-shaped magnet array 51 and 53 respectively serve as an outer and an inner ring-shaped magnetic pole array, while as previously mentioned, each of the ring-shaped magnet arrays 52, 54, and 55 located between the ring-shaped magnet arrays 51 and 53 serves as both of an outer and an inner ring-shaped magnetic pole array. FIG. 1 shows a simplified view of the magnet array body 4.

At this time, as shown in FIG. 3, each of the N pole members 5a is connected to the rotation plate 41 via a corresponding support column 56. Further, each of the bipolar members 5b is configured to be rotatable around the corresponding vertical axis. Specifically, there is provided between the upper side of each of the bipolar members 5b and the rotation plate 41, a rotating mechanism 57, such as a motor, serving as an operating unit connected to each of the bipolar members 5b. Each of the bipolar members 5b is connected to a lower end of a rotating shaft 58 extending downwardly from the corresponding rotating mechanism 57. The support columns 56 and the rotating shafts 58 are configured to make the bottom surfaces of the N pole members 5a and the bipolar members 5b located at a same height position.

Figure 8:
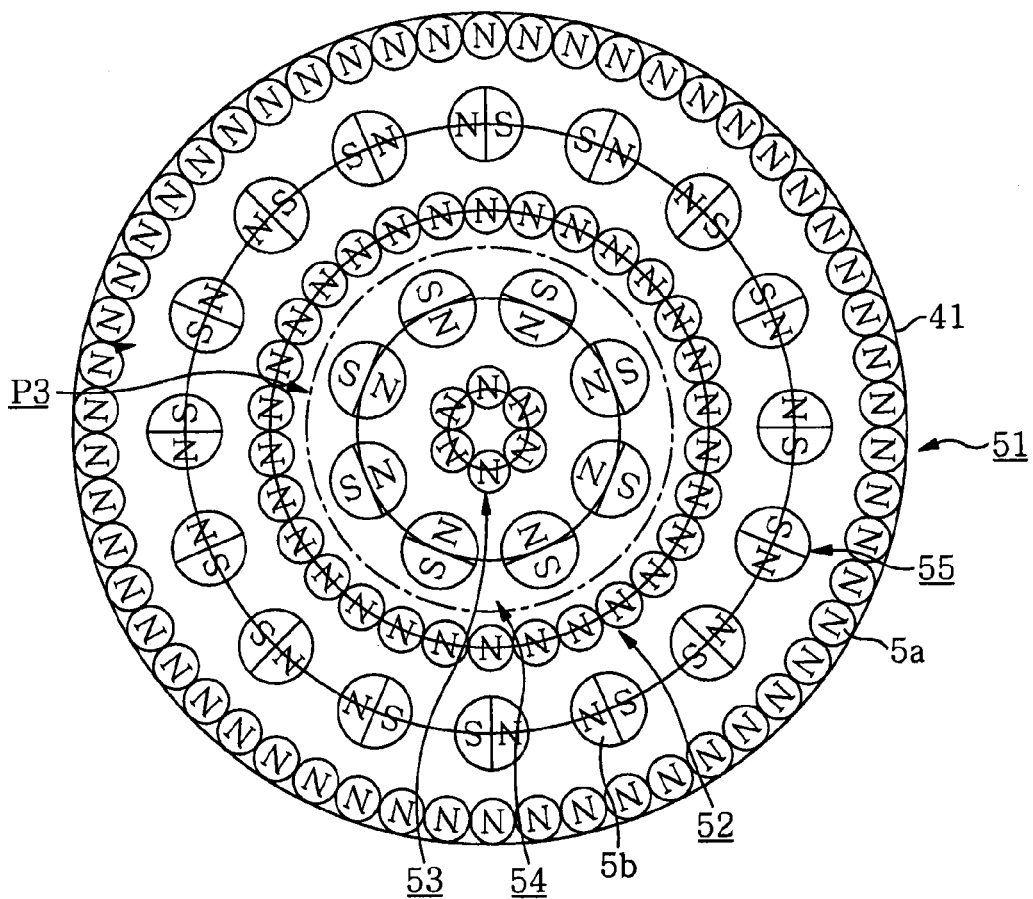
FIG. 8 is a plan view showing a third configuration of the magnet array body.
Figure 10:
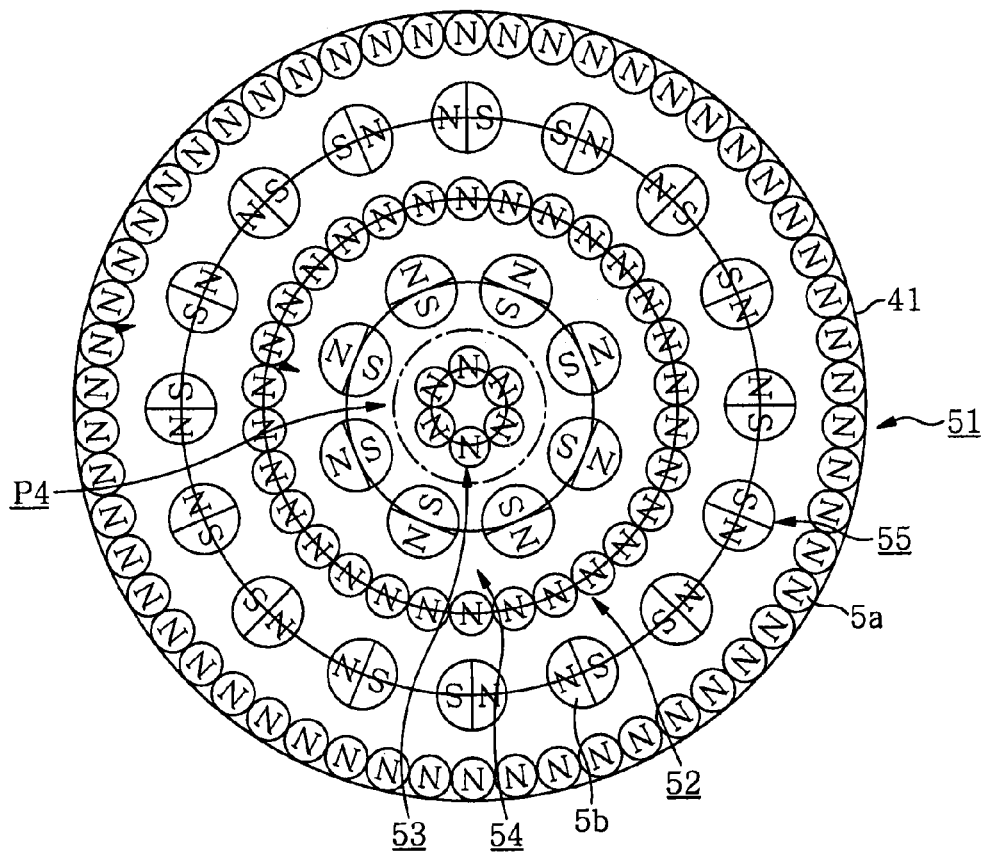
FIG. 10 is a plan view showing a fourth configuration of the magnet array body.

As shown in FIG. 8 and FIG. 10, the second auxiliary ring-shaped magnet array 54 is configured to be switchable between an orientation (FIG. 8) in which a magnetic field is generated between the second auxiliary rig-shaped magnet array 54 and the second main ring-shaped magnet array 52 and an orientation (FIG. 10) in which a magnetic field is generated between the second auxiliary rig-shaped magnet array 54 and the third main ring-shaped magnet array 53.

Specifically, when magnetic fields are generated between the second auxiliary ring-shaped magnet array 54 and the second main ring-shaped magnet array 52 as shown in FIG. 8, the bipolar members 5b of the second auxiliary ring-shaped magnet array 54 are disposed in such a way that N poles are disposed on the side of the third main ring-shaped magnet array 53, while S poles are disposed on the side of the second main ring-shaped magnet array 52. In addition, when a magnetic field is generated between the second auxiliary ring-shaped magnet array 54 and the third main ring-shaped magnet array 53 as shown in FIG. 10, the bipolar members 5b of the second auxiliary ring-shaped magnet array 54 are disposed in such a way that S poles are disposed on the side of the third main ring-shaped magnet array 53, while N poles are disposed on the side of the second main ring-shaped magnet array 52.

Therefore, when a magnetic field is generated between the second auxiliary ring-shaped magnet array 54 and one of the second main ring-shaped magnet array 52 and the third main ring-shaped magnet array 53, a magnetic field is hardly generated between the second auxiliary ring-shaped magnet array 54 and the other one.

Figure 6:
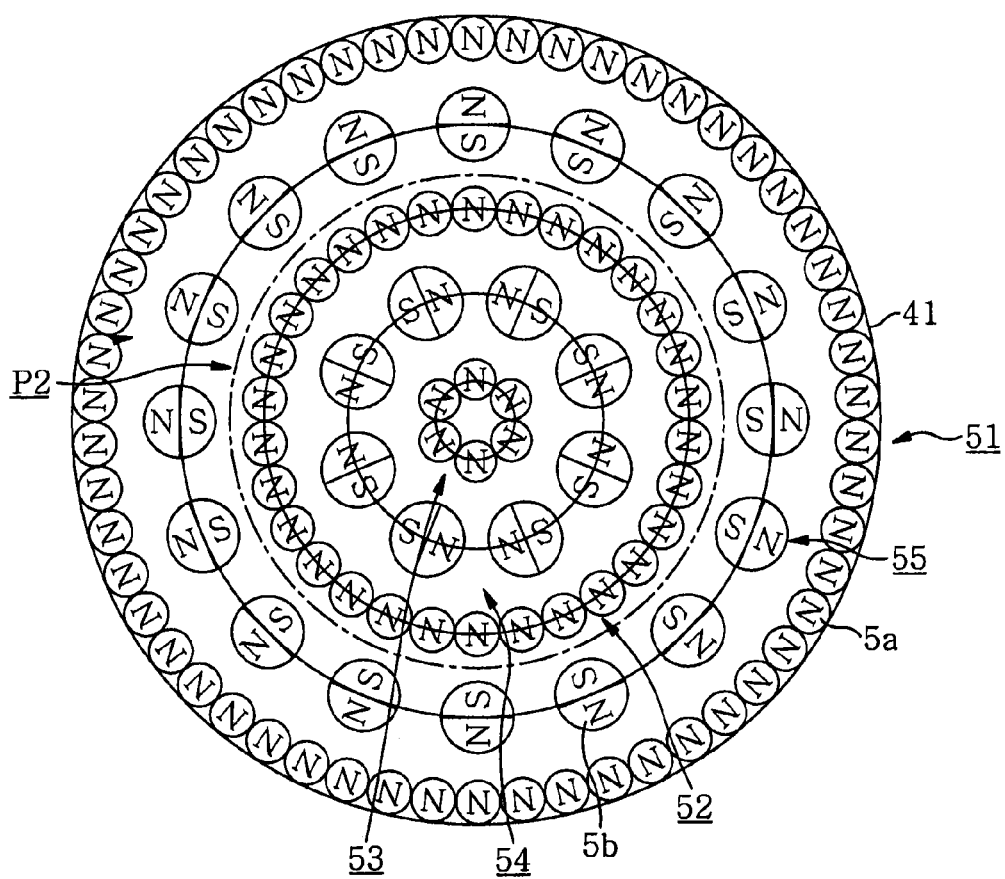
FIG. 6 is a plan view of a second configuration of the magnet array body.

Further, positions of the bipolar members 5b of the second auxiliary ring-shaped magnet array 54 can be adjusted in such a way that the magnetic field is hardly generated between the second auxiliary ring-shaped magnet array 54 and both of the second and the third main ring-shaped magnet array 52 and 53. In other words, as shown in FIG. 2 and FIG. 6, the positions of the bipolar members 5b of the second auxiliary ring-shaped magnet array 54 are adjusted in such a way that the magnetic poles of the bipolar members 5b faces the circumferential direction of the rotation plate 41.

Specifically, the position of each of the bipolar members 5b is adjusted such that S pole and N pole respectively face a clockwise direction and a counterclockwise direction in the circumferential direction of the rotation plate 41. Further, the position of each of the bipolar members 5b of the second auxiliary ring-shaped magnet array 54 is adjusted to have S poles of the adjoining members 5b face each other and N poles of the adjoining members 5b face each other, so that the generation of a magnetic field is inhibited between the bipolar members 5b of the second auxiliary ring-shaped magnet array 54.

The first auxiliary ring-shaped magnet array 55 is configured to be switchable between an orientation in which a magnetic field is generated between the first auxiliary ring-shaped magnet array 55 and the first main ring-shaped magnet array 51 (FIG. 2) and an orientation in which a magnetic field is generated between the first auxiliary ring-shaped magnet array 55 and the second main ring-shaped magnet array 52 (FIG. 6) to generate a corresponding magnetic field by respectively rotating the bipolar members 5b of the first auxiliary ring-shaped magnet array 55 around the corresponding vertical axes. In concordance with the second auxiliary ring-shaped magnet array 54, when a magnetic field is generated between the first auxiliary ring-shaped magnet array 55 and one of the main ring-shaped magnet arrays 51 and 52, a generation of a magnetic field is inhibited between the first auxiliary ring-shaped magnet array 55 and the other one.

Additionally, as shown in FIG. 8 and FIG. 10, the generation of a magnetic field is inhibited between each of the bipolar members 5b of the first auxiliary ring-shaped magnet array 55 by rotating the rotating shaft 58 in such a way that the magnetic poles of each of the bipolar members 5b of the first auxiliary ring-shaped magnet array 55 faces the circumferential direction of the rotation plate 41, and the S poles and N poles are opposite of each other in the circumferential direction.

As such, as shown in FIGS. 2, 6, 8, and 10, by adjusting the position of each bipolar member 5b of the auxiliary ring-shaped magnet arrays 54 and 55, the magnet array body 4 is configured to generate annular magnetic fields P1, P2, P3, and P4 of the different diameter dimensions, from the outer periphery side towards the inner periphery side of the rotation plate 41. In continuance, P1 in FIG. 2 indicates the magnetic field generated between the first auxiliary ring-shaped magnet array 55 and the first main ring-shaped magnet array 51, wherein the S poles of the first auxiliary ring-shaped magnet array 55 face an outward direction and the S poles of the second auxiliary ring-shaped magnet array 54 face a circumferential direction thereof.

P2 in FIG. 6 indicates the magnetic field generated between the first auxiliary ring-shaped magnet array 55 and the second main ring-shaped magnet array 52, wherein the S poles of the first auxiliary ring-shaped magnet array 55 face an inside direction and the S poles of the second auxiliary ring-shaped magnet array 54 face the circumferential direction thereof. The description of the N poles of the auxiliary ring-shaped magnet arrays 54 and 55 will be omitted.

P3 in FIG. 8 indicates the magnetic field generated between the second auxiliary ring-shaped magnet array 54 and the second main ring-shaped magnet array 52, wherein the S poles of the first auxiliary ring-shaped magnet array 55 face a circumferential direction thereof and the S poles of the second auxiliary ring-shaped magnet array 54 face an outside direction. P4 in FIG. 10 indicates the magnetic field generated between the second auxiliary ring-shaped magnet array 54 and the third main ring-shaped magnet array 53, wherein the S poles of the first auxiliary ring-shaped magnet array 55 face the circumferential direction thereof and the S poles of the second auxiliary ring-shaped magnet array 54 face an inside direction. In accordance with the result of an simulation calculated by assuming that the width of the annular erosion is 1.5 mm, the areas of the plasma occurring regions generated by magnetic fields P1 to P4 are for example, 160 cm$^2$, 104 cm$^2$, 66 cm$^2$, and 24 cm$^2$, respectively.

The magnetron sputtering apparatus includes a control unit 60, formed of a computer to control the execution of the total operation, including a memory which stores a program required for executing the film forming process, which will be later described. The steps of the program, to run the operation of this apparatus to be described later, is organized into groups, and is stored in a memory unit 61 serving as a storage medium, e.g., a hard disk, a compact disk, a magneto-optical disk, a memory card, a flexible disk, or the like, and is installed from the memory unit 61 into the control unit 60.

Hereinafter, the film forming process of the magnetron sputtering apparatus will be described. First, the wafer w is loaded through the transfer port 26a into the vacuum chamber 2 to be mounted on the mounting table 3. Then, the vacuum chamber 2 is sealed airtight, and the mounting table 3 is raised to the processing position. At this time, the S poles of the second auxiliary ring-shaped magnet array 54 and the first auxiliary ring-shaped magnet array 55 are disposed to face in the circumferential direction thereof, so that the generation of a magnetic field is inhibited.

Thereafter, nitrogen gas and argon gas are supplied into the vacuum chamber 2, whose inner atmosphere is set at a range from about, e.g., 0.46 Pa to 13.3 Pa (11 mTorr to 100 mTorr). Further, while the magnet array body 4 is eccentrically rotated, a negative DC voltage ranging from about 0.1 kW to 10 kW is applied to the target 21. Furthermore, a high frequency voltage ranging from about several hundreds of kHz to 100 MHz is applied to the mounting table 3 at a power level ranging from about 10 W to 2 kW.

Next, the positions of the bipolar members 5b of the second and the first auxiliary ring-shaped magnet array 54 and 55 of the magnet array body 4 are adjusted to generate the magnetic field P1 as shown in FIG. 2. At this time, a DC voltage is applied to the target 21 and a thus-generated electric field ionizes argon gas thereby generating electrons in the vacuum chamber 2. Accordingly, in the vacuum chamber 2, the annular magnetic field P1 is generated in the circumferential direction of the rotation plate 41 based on the cusp magnetic field 100 by the first auxiliary ring-shaped magnet array 55 and the first main ring-shaped magnet array 51.

Further, the electrons are accelerated and drift by the electric field and the magnetic field P1. The electrons collide with argon gas to be ionized as shown in FIG. 5 to thereby form a ring-shaped plasma region 10. Further, when nitrogen gas contacts with a plasma in the plasma region 10, the nitrogen gas is activated and as a result, an active species (ions or radicals) is generated. The shape of the eccentric rotation of the magnet array body 4 has been omitted in the diagram of FIG. 5. This omission also applies to FIG. 7, FIG. 9 and FIG. 11.

Additionally, as shown in FIG. 5, a titanium nitride film is formed on the surface of the wafer w below the plasma region 10 by the active species of nitrogen gas and argon ions which are generated in the plasma region 10. Specifically, if the pressure of the nitrogen gas is relatively low in the vacuum chamber 2, the target 21 is sputtered by the argon ions to produce titanium particles, and the titanium particles adhere to the wafer w and is nitrided by the active species of nitrogen gas. Contrarily, if the pressure of the nitrogen gas is relatively high in the vacuum chamber 2, the target 21 is nitrided by the active species of nitrogen gas to form a titanium nitride film, and the titanium nitride film is sputtered by the argon ions to be deposited onto the wafer w. Consequently, the titanium nitride film formed on the wafer w has, e.g., such a ring shape as to follow the outline of the outer circumference of the wafer w.

Figure 7:
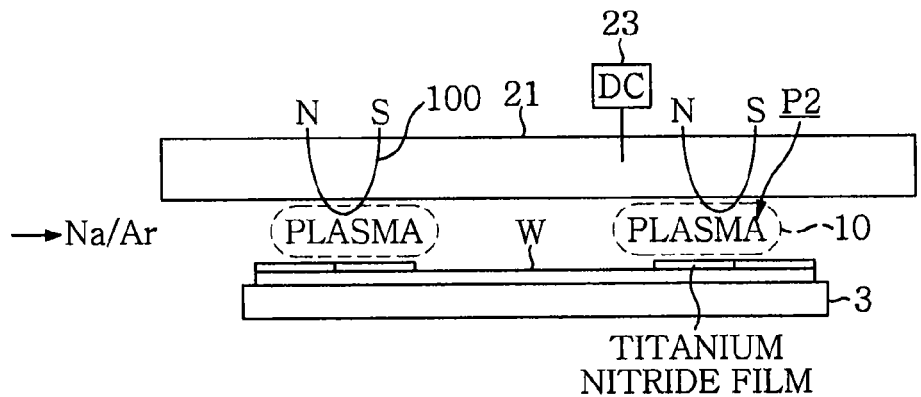
FIG. 7 is a side view showing a second step of the film forming process of the magnetron sputtering apparatus.
Figure 9:
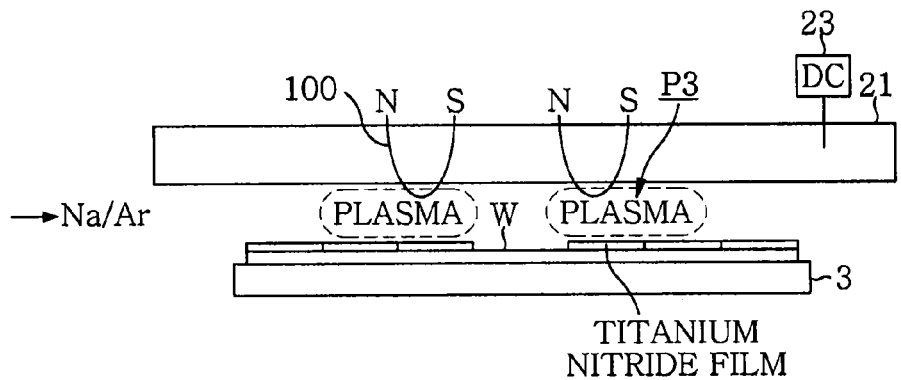
FIG. 9 is a side view showing a third step of the film forming process of the magnetron sputtering apparatus.

Next, a ring-shaped titanium nitride film is also formed, as shown in FIG. 7, on the inner side of the ring-shaped titanium nitride film that has been formed on the outer circumference of the wafer W by the magnetic field P1 by adjusting the positions of the bipolar members 5b of the first auxiliary ring-shaped magnet array 55 to generate the magnetic field P2 between the first auxiliary ring-shaped magnet array 55 and the second main ring-shaped magnet array 52 as shown in FIG. 6. In continuance, a ring-shaped titanium nitride film is also formed, as shown in FIG. 9, on the inner side of the ring-shaped titanium nitride film that has been, by the magnetic field P2, by generating the magnetic field P3 between the second auxiliary ring-shaped magnet array 54 and the second main ring-shaped magnet array 52 as shown in FIG. 8.

Then, a substantially circular titanium nitride film is formed at the center of the wafer w as if to bury an inner portion of the ring-shaped titanium nitride film that has been formed by the magnetic field P3, by generating the magnetic field P4 between the second auxiliary ring-shaped magnet array 54 and the third main ring-shaped magnet array 53 as shown in FIG. 10. As such, a titanium nitride film having a desired film thickness is formed by repeating multiple times a series of film forming steps using the magnetic field P1 to P4, to temporally switch the magnetic pole array set, formed of two adjacent ones of the ring-shaped magnet arrays (ring-shaped magnetic pole arrays) 51 to 55, which generates the ring-shaped cusp magnetic field 100.

Hereinafter, the power values of when a negative DC voltage is applied to the target 21 to generate each magnetic field P1 to P4 and the film formation processing time for each magnetic field P1 to P4 (the time that each magnetic field P1 to P4 is maintained) will be described. First, the power values are described in accordance with, e.g., FIG. 4, which shows that the areas of the ring-shaped plasma regions 10 formed by the respective magnetic field P1 to P4 are different from each other. Thus, if the same power values to generate each magnetic field P1 to P4 were applied to the target 21, the degree of each of the plasma intensities may fluctuate. Specifically, the plasma intensity in the central portion of the target 21 may become stronger than that in the periphery thereof.

Figure 13A:
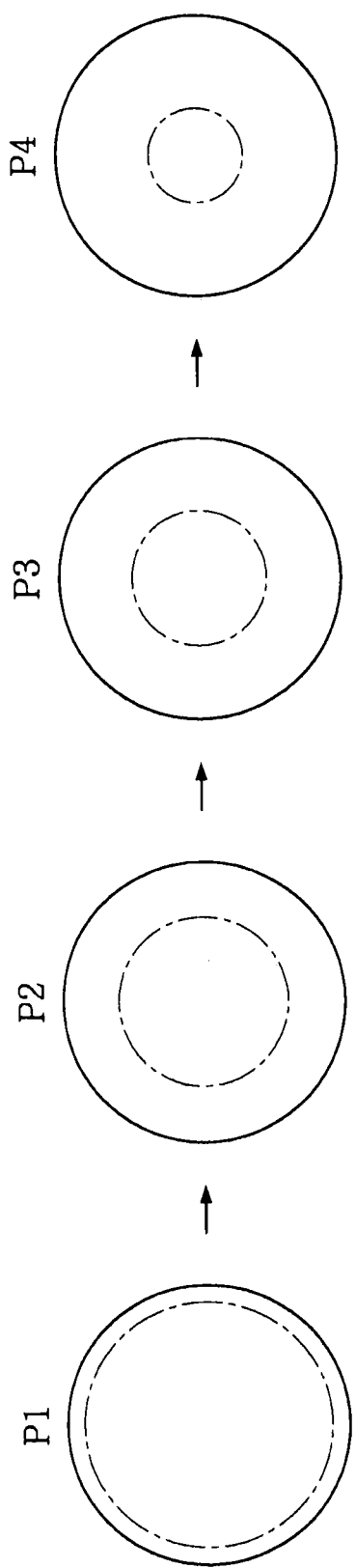
Figure 13B:
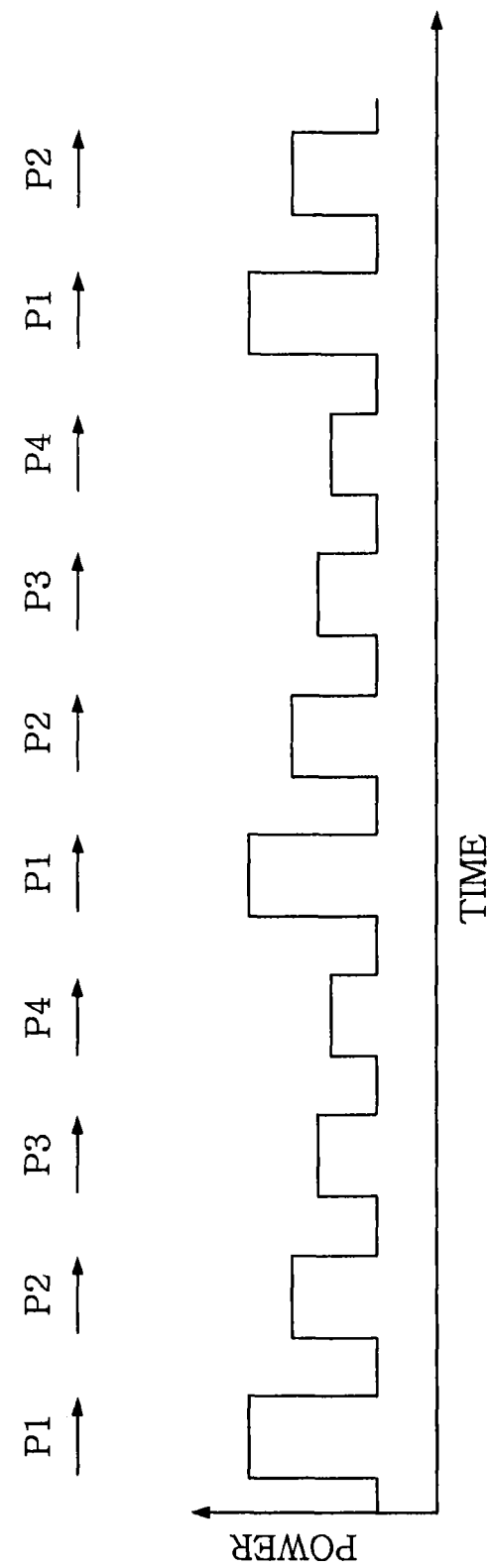
Figure 14:
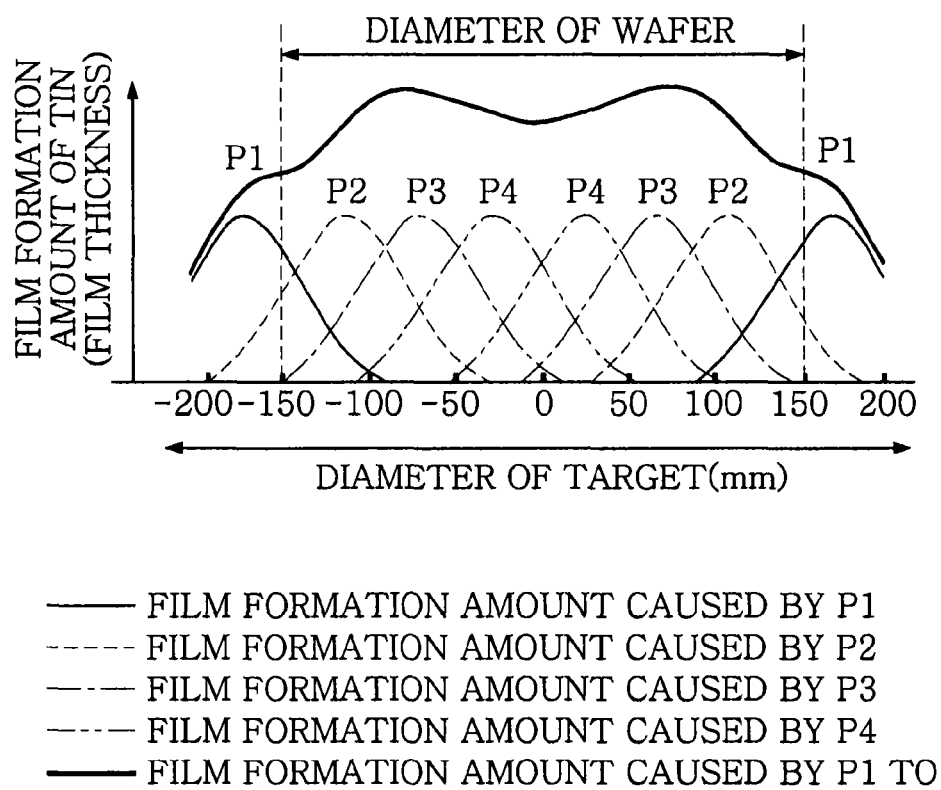

Hence, as shown in FIGS. 13A and 13B, in order to obtain the uniform plasma intensities of the magnetic fields P1 to P4, that is, to match power densities obtained by respectively dividing the surface areas of the plasma regions by the corresponding power values that are supplied to the target 21, the power values are set in such a way as to generate the magnetic fields P1, P2, P3 and P4 whose intensities weaken in that order (P1>P2>P3>P4). Specifically, the power values are set to, for example, 3300 W, 2100 W, 1300 W, and 500 W to generate the plasma region 10 by the magnetic fields P1 to P4, respectively. Although each of the power densities is almost about the same, 20 W/cm$^2$, the power density is optimized by the desired film nitrification density. As a result, the composition of the titanium nitride film formed on the wafer w (the ratio of the nitrogen contained in the titanium nitride film) becomes uniform throughout the surface of the wafer W.

In other words, the nitrogen gas, which is supplied to each of the ring-shaped plasma regions 10 formed by the magnetic fields P1 to P4, is not consumed outside of the corresponding plasma region 10, or the amount consumed is suppressed to be extremely small. For example, in the case of the magnetic field P1 in FIG. 5, the nitrogen gas which is supplied from an outer periphery of the plasma forming region 10 formed on the outer peripheral side of the target 21 is activated in the plasma forming region 10, and this contributes to the formation of the titanium nitride film.

In addition, in the case of the magnetic field P2 in FIG. 7, the magnetic field P1 is not formed outside the magnetic field P2, and thus the nitrogen gas which is supplied from the outer peripheral side of the plasma region 10 is not activated or almost not activated at all until the nitrogen gas reaches the plasma region 10 formed by the magnetic field P2. As a result, the amount of nitrogen gas that is supplied to the plasma region 10 formed by the magnetic field P2 substantially equals the amount of nitrogen gas which is supplied the plasma region 10 formed by the magnetic field P1. Also as described above, when each plasma region 10 is generated by the magnetic fields P1 and P2, the powers having substantially the same density are supplied to the target 21 and as a result, the amount of the active species generated by the nitrogen gas in each of the plasma regions 10 is also equal. Therefore, the amount of nitrogen gas consumed during the thin film formation performed by using the magnetic field P1 will be matched with that consumed during the thin film formation performed by using the magnetic field P2.

Further, in the case of the magnetic field P3 in FIG. 9, no plasma region 10 is formed by the magnetic fields P1 and P2 generated outside of the magnetic field P3, and the nitrogen gas is directly supplied to the plasma region 10 formed by the magnetic field P3. Accordingly, the amount of nitrogen gas supplied to the plasma region 10 is equal to the amounts of nitrogen gas in the cases of the magnetic fields P1 and P2. Furthermore, the density of the power supplied to the target 21 is the same as those in the cases of the magnetic fields P1 and P2. Therefore, the nitrogen ratio during the formation of the thin film by the magnetic field P3 is also equal to that in the outer peripheral side of the plasma region 10. Similarly, the consumption of nitrogen gas can be inhibited on an outer peripheral side of the plasma region 10 formed by the magnetic field P4. Further, since the density of the power supplied to the target 21 is same as that on the outer peripheral side thereof, the nitrogen ratio during the thin film formation equals that on the outer peripheral side thereof. Therefore, the nitrogen ratio during the formation of the thin film at each plasma region 10 is the same and the power density is also the same and as a result, an in-plane uniformity in the composition of the titanium nitride film during the formation is obtained.

Hereafter, the processing times of the film formation processes in the cases of each magnetic field P1 to P4 will be described.

In the case when the diameter dimension of the target 21 is sufficiently large in relation to the diameter dimension of the wafer w, and each magnetic field P1 to P4 has the same plasma intensity (power density), as shown in FIGS. 12A and 12B, if it is possible for each ring-shaped magnet array 51 to 55 to be disposed in such a way so that the erosion of the target 21 is uniformly formed over the surface of the target 21, an in-plane uniform film thickness distribution of the titanium nitride film is obtained.

FIGS. 12A and 12B show the simulation results obtained by setting radii of each of the ring-shaped erosion formed by each ring-shaped magnet array 51 to 55 to 187 mm, 134 mm, 80 mm, and 27 mm, when the diameter dimensions of the wafer w and the target 21 are respectively set at 300 mm and 400 mm. The good results show the variation of the film thickness on the surface of the wafer w at approximately 0.5%. This simulation also shows how the particles are radially scattered from the target 21.

However, in the real apparatus, the ideally spaced erosion may not be formed (each ring-shaped magnet array 51 to 55 may not be disposed). Specifically, in accordance with the simulation results of FIG. 14, the film thickness variation is approximately 10% more deteriorated than the result shown in FIGS. 12A and 12B when the radial dimension of each erosion is set at 170 mm, 110 mm, 70 mm, and 25 mm. Thus, in the present embodiment as described above, the film formation processing time (the time that the plasma regions 10 are maintained) for each magnetic field P1 to P4 is controlled in such a way that even if it is difficult to ideally arrange each ring-shaped magnet array 51 to 55, the titanium nitride film having uniform thickness can be acquired.

Figure 11:
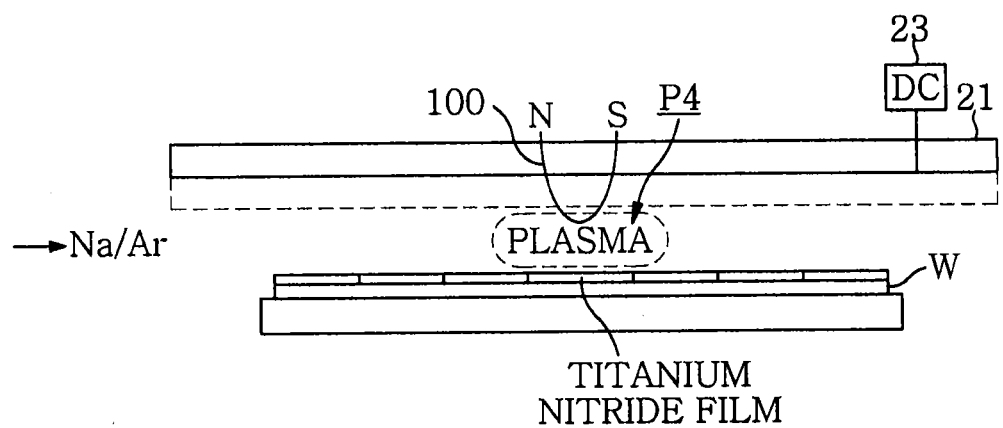
FIG. 11 is a side view showing a fourth step of the film forming process of the magnetron sputtering apparatus.
Figure 15B:
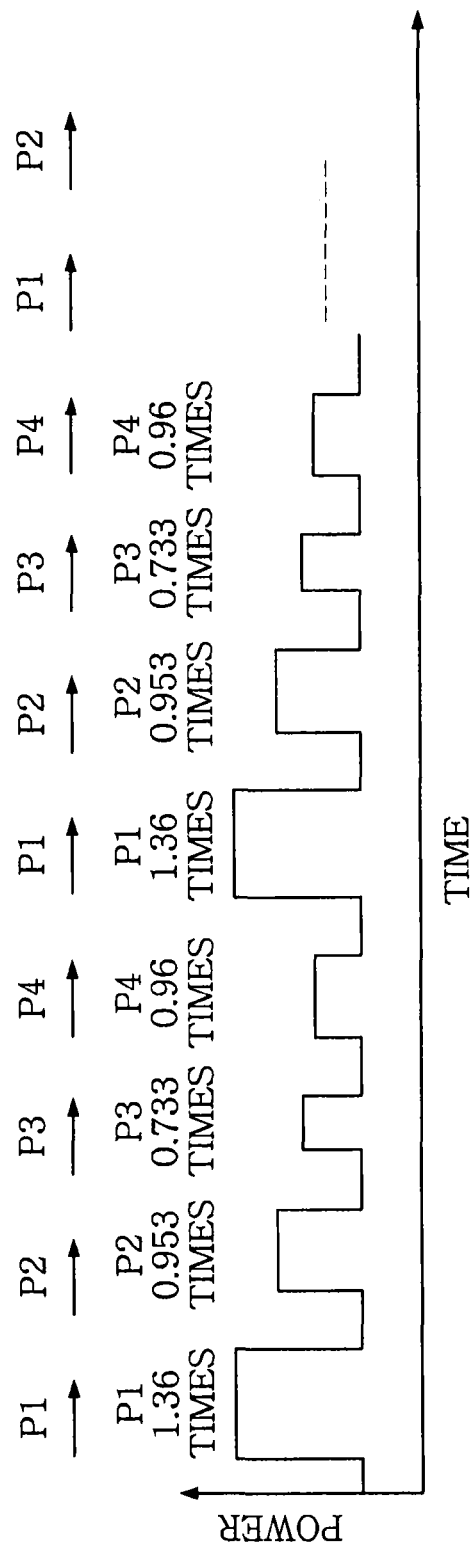
Figure 16:
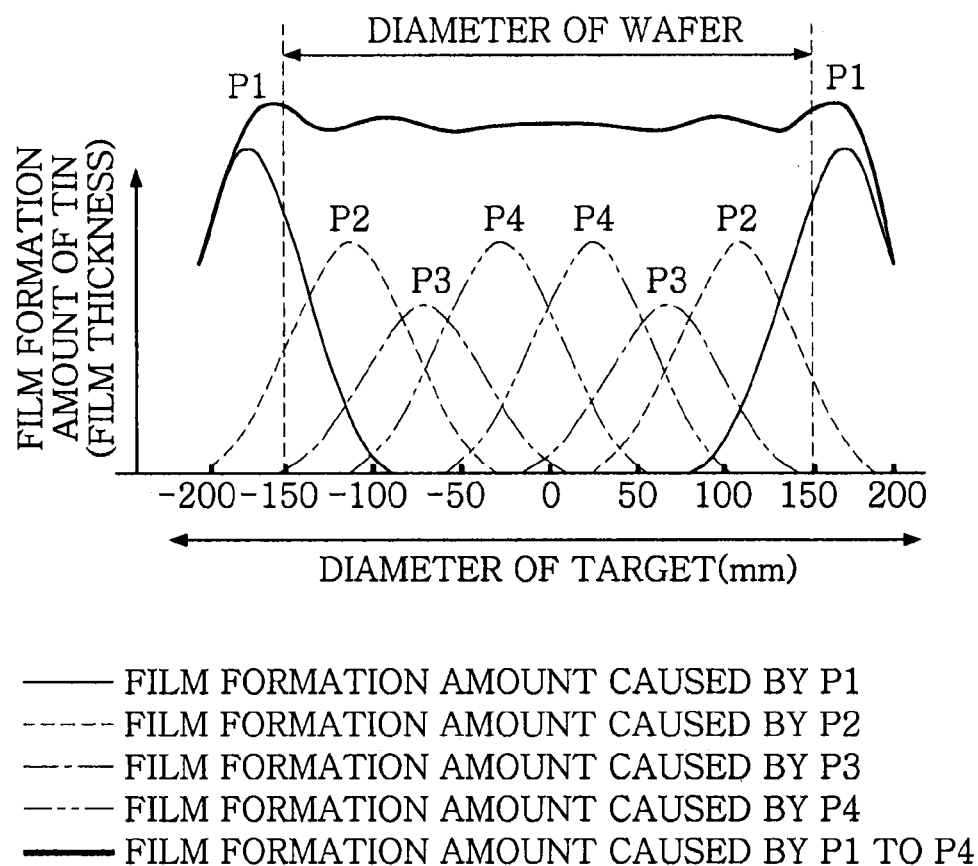

As shown in FIGS. 15A and 15B, if the desired length of time is determined as, for example, "1", the required film formation processing time for each magnetic field P1 to P4 is set to 1.36, 0.953, 0.733 and 0.96. Therefore, even in the case where the radial dimension of each erosion is set at 170 mm, 110 mm, 70 mm, and 25 mm as such shown in FIG. 14, the film thickness has a good uniformity with a variation of about 1.2%, as such shown in FIG. 16. Also, even if the film formation processing time for each magnetic field P1 to P4 is controlled, an in-plane uniform power density is obtained as mentioned above. Accordingly, the non-uniformity in the composition of the titanium nitride film is suppressed, and the film thickness becomes uniform. Therefore, as shown in FIG. 11, the sputtering amount (the amount of erosion) of the target 21 by argon ions is made uniform across the surface of the target 21. Additionally, as above mentioned, a high frequency bias power is supplied to the mounting table 3, and thus it is possible to obtain a dense thin film having low electrical resistance. The illumination of the erosion of the target 21 is omitted in FIGS. 5, 7, and 9.

FIGS. 12A and 12B, 14, and 16 shows the simulation results of when the magnet array body 4 is not eccentrically rotated. For example, if the range of the particles sputtered from the sputtered target 21 is narrower than the simulation results, the titanium nitride film having uniform thickness can be obtained by eccentrically rotating the magnet array body 4. It is preferable that the eccentricity of the magnet array body 4 (the distance between the center of the wafer w or the target 21 and the center of the magnet array body 4) is less than the radius of the magnetic field P4.

As for any one magnetic field P of the magnetic field P1 to P4, since the nitrogen gas is supplied from the outer periphery side of the corresponding magnetic field first and is then consumed as it goes towards the inner side, slight non-uniformity may occur in the amount of active species of nitrogen gas between the outer periphery end and the inner periphery end of the magnetic field P. However, as mentioned above, since the distance h between the target 21 and the wafer w during the film forming process is so small, the slight non-uniformity hardly affects the film forming process. Further, by eccentrically rotating the magnet array body 4, the slight non-uniformity is resolved and the titanium nitride film having uniform thickness and composition can be obtained.

According to the above-mentioned embodiment, the ring-shaped magnet arrays 51-55 are disposed in such a way as to form each magnetic field P1 to P4 in the circumferential direction of the wafer w, and then the sputtering film forming process is performed on the wafer w by switching between the magnetic fields P1 to P4. Thus, a thin film having an in-plane uniform thickness is obtained.

Further, as mentioned above, in the case when argon gas and nitrogen gas are supplied to the plasma region 10 and a titanium nitride film is formed by the reaction between the active species of nitrogen gas and the target 21, the titanium nitride film can achieve uniformity with respect to film thickness and film quality (composition).

Thus, as mentioned above, the target 21 and the wafer w can be placed close to each other. As the distance h between the wafer w and the target 21 get shorter, the transfer of the erosion formed on the target 21 onto the wafer W becomes easier. However, in accordance with the present embodiment, the erosion is formed uniformly over the surface of the target 21, and thus the distance h can be narrowed. As a result, a sputtering apparatus with excellent film formation speed and high use efficiency of the target 21 can be configured. Additionally, since the uniform erosion is formed on the target 21, the target 21 is suppressed from being locally eroded, which can suppress the replacing frequencies (promote the effective use) of the target 21.

It has been previously noted that there are differences in the film forming process of the titanium nitride film when the concentration of nitrogen gas inside the vacuum chamber 2 is comparatively low and comparatively high. However, the film forming process is uniform within the surface of the wafer W since the concentrations of nitrogen gas in the plasma regions 10 formed by the magnetic field P1 to P4 matches each other because a non-uniformity in the concentration of the nitrogen gas is difficult to generate in the radial direction of the wafer w.

Therefore, it is possible to match the appropriate values (power densities) of the power supplied to the target 21. Further, since the forming process is uniform within the surface of the wafer W, the film formation process can be expedited (a good film forming rate can be obtained) by increasing the pressure of nitrogen gas to the extent where the target 21 is nitrided inside the vacuum chamber 2.

In the aforementioned example, it is advisable to calculate based on the width dimensions of the erosion or the dimensions between the adjoining ring-shaped magnet arrays in relation to the areas of the plasma regions 10 formed by each magnetic field P1 to P4. It is also advisable to calculate based on the thickness distribution of the titanium nitride film that is formed on the wafer w. Among the main ring-shaped magnet arrays 51 to 55, it is advisable that the magnetic poles are configured to become the S poles on the side of the target 21.

Second Embodiment

According to the first embodiment described above, in the case where the magnet array body 4 is not eccentrically rotated, that is, the magnet array body 4 is rotated around the vertical axis extending through the center of the wafer W, the erosion of the target 21 is difficult to generate at the bottom positions of the main ring-shaped magnet arrays 51 to 53.

Further, even though the magnetic fields generated by the auxiliary magnet arrays are in rotational positions which inhibit sputtering, an unintended, not-so-small erosion may occur because some of the magnetic fields are formed at opposite sides of a radius direction. Therefore, in the second embodiment described below, the target 21 is configured in such a way that the erosion occurs uniformly over the surface of the target 21 even when the magnet array body 4 is not eccentrically rotated. Furthermore, the intended ring-shaped erosion can be accurately formed.

Figure 17:
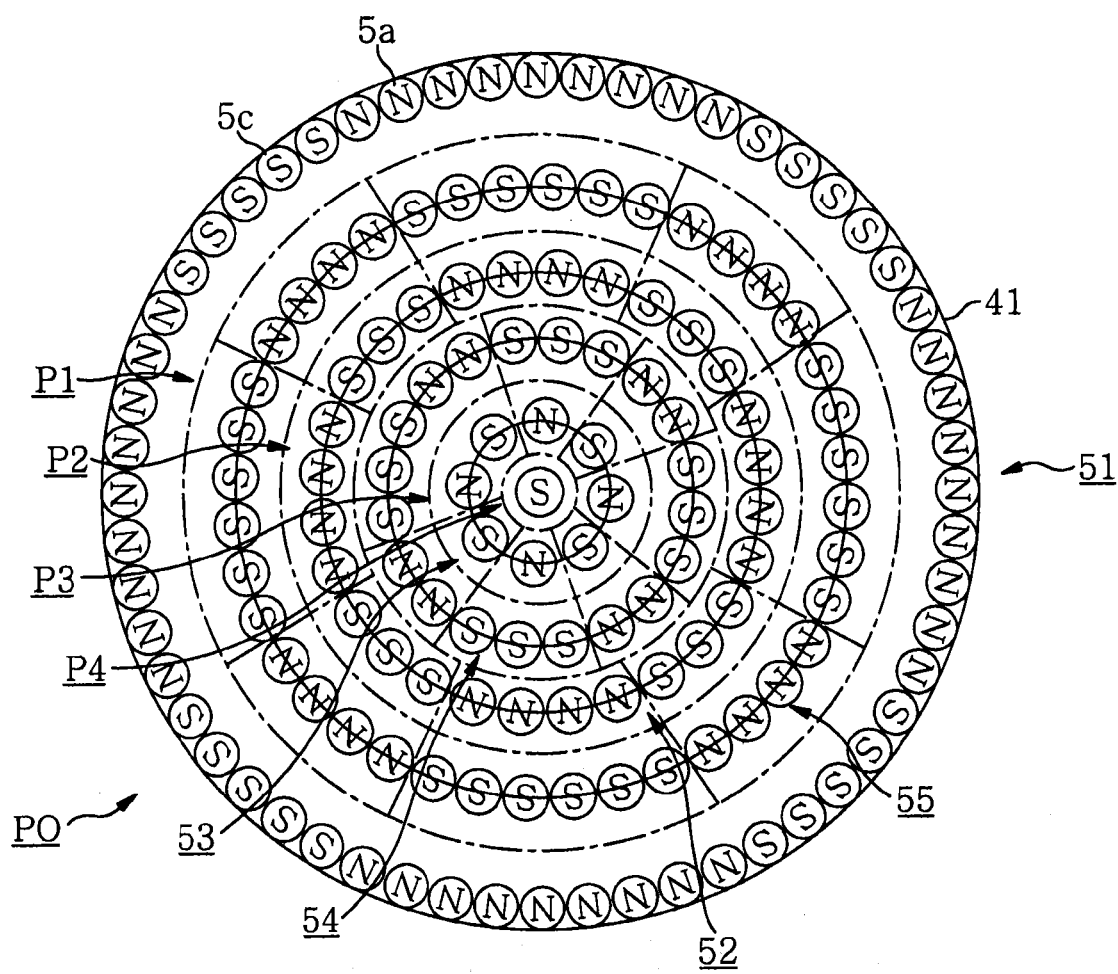
FIG. 17 is a plan view showing an example of a magnet array body included in the magnetron sputtering apparatus in accordance with the second embodiment of the present invention.

Specifically, as shown in FIG. 17, each of the ring-shaped magnet arrays 51 to 55 includes the N pole member 5a in which the magnetic poles on the side of the target 21 become N poles; and the S pole member 5c in which the magnetic pole become S poles, both of which are arranged in the circumferential direction of the rotation plate 41.

The first main ring-shaped magnet array 51 is formed of a total of fifty-four magnet members which includes sets of nine N pole members 5a and five S pole members 5c of which are alternately disposed in the circumferential direction. The first auxiliary ring-shaped magnet array 55 is formed of a total of forty magnet members which includes sets of four N pole members 5a and six S pole members 5c of which are alternately disposed in the circumferential direction. The second main ring-shaped magnet array 52 is formed of a total of twenty-eight magnet members which includes sets of four N pole members 5a and three S pole members 5c of which are alternately disposed in the circumferential direction. The second auxiliary ring-shaped magnet array 54 is formed of a total of twenty magnet members which includes sets of two N pole members 5a and three S pole members 5c of which are alternately disposed in the circumferential direction. The third main ring-shaped magnet array 53 is formed of a total of eight magnet members which includes one of each N pole member 5a and S pole member 5c of which are alternately disposed in the circumferential direction. In addition, one of the S pole members 5c is disposed in a corresponding position to the center of the rotating plate 41 on the inner side of the third main ring-shaped magnet array 53.

Figure 18:
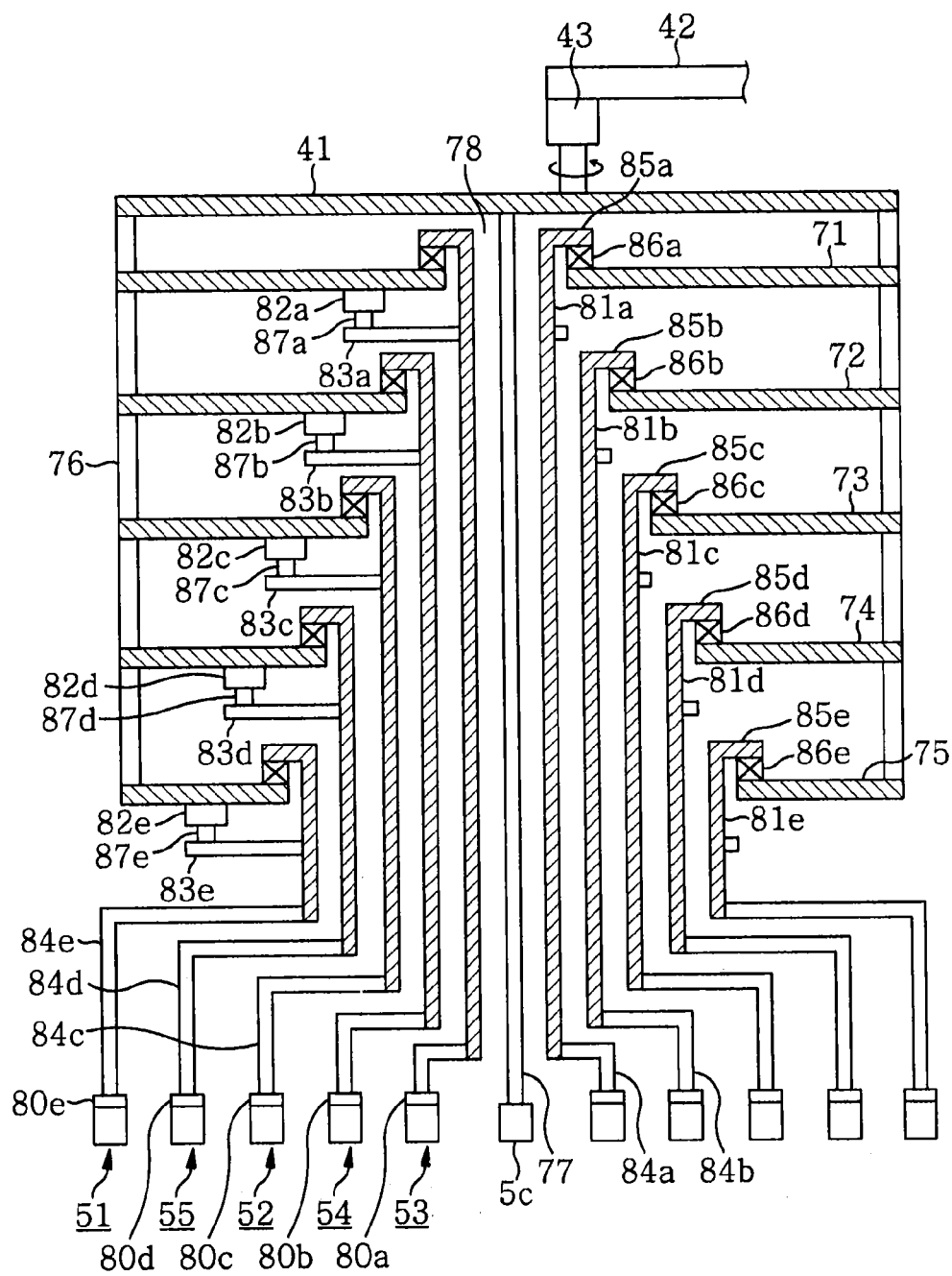
FIG. 18 is a longitudinal cross-sectional view showing an example a rotating unit for rotating a magnet array body in accordance with the second embodiment.

When seen from a plan view, each of the ring-shaped magnet arrays 51 to 55 is configured to facilitate independent rotation around the vertical axis extending through the center of the rotation plate 41. An example of a mechanism for rotating the respective ring-shaped magnet arrays 51 to 55 will be described hereinafter. Specifically, as shown in FIG. 18, below the rotation plate 41, there are included five rotation plates 71 to 75 which are parallel to the rotation plate 41 and fixed by a support columns 76 extending vertically on the periphery side of the rotation plates 41, 71 to 75.

A fixed member 77 extending downwardly is coupled to the center of the bottom surface of the rotation plate 41 to support the S pole member 5c disposed on the inner side of the third main ring-shaped magnet array 53. On the lower side of the rotation plate 41, there is included a substantially conical opening 78 extending through the center of the rotation plates 71 to 75. Within the opening 78, in order to independently rotate each of the ring-shaped magnet arrays 51 to 55, there is included a tubular member 81, a rotation unit 82 and a belt 83 all of which are individually provided to each ring-shaped magnet arrays 51 to 55.

Figure 19:
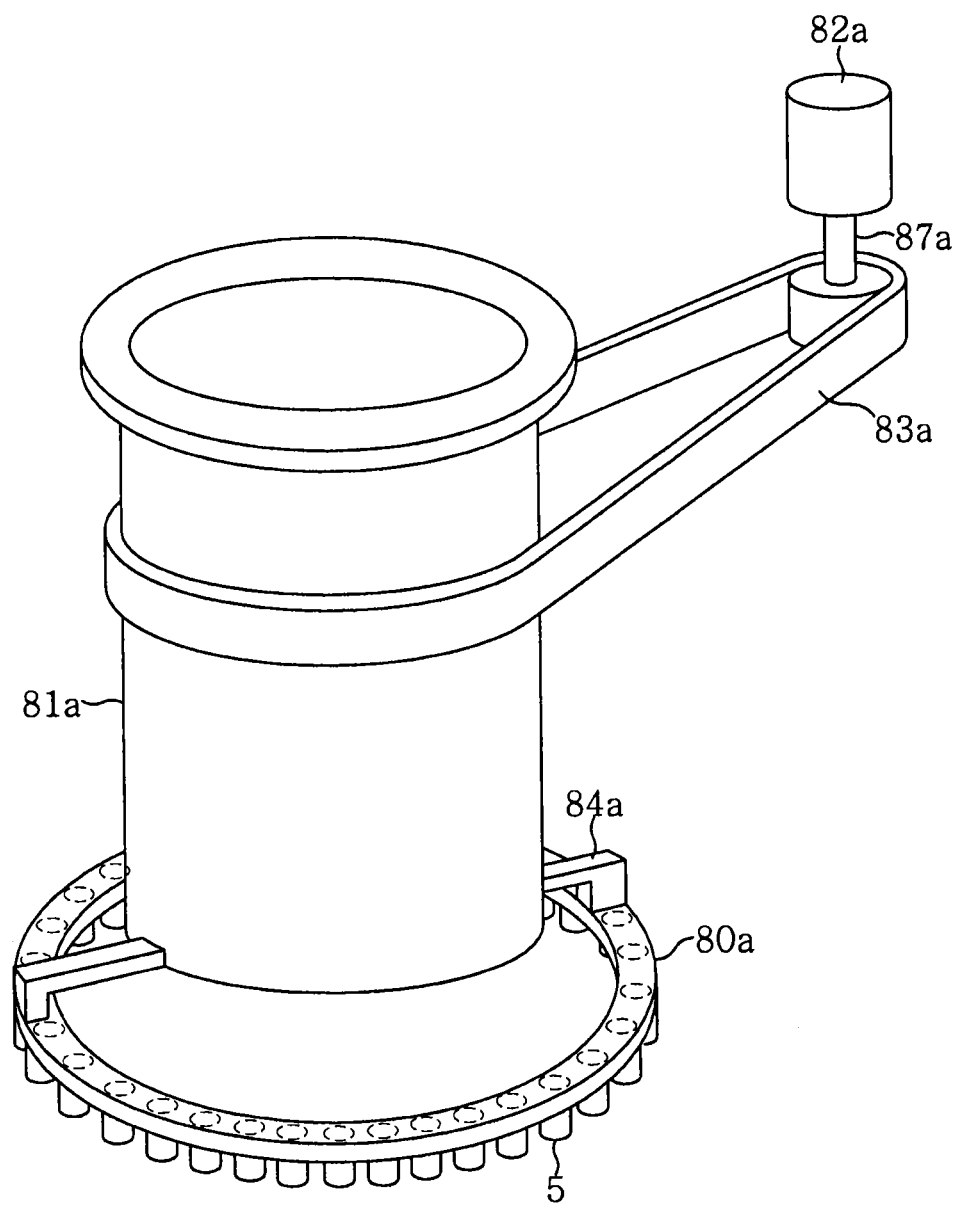
FIG. 19 is a perspective view showing a part of the rotating unit in accordance with the second embodiment.
Figure 20:
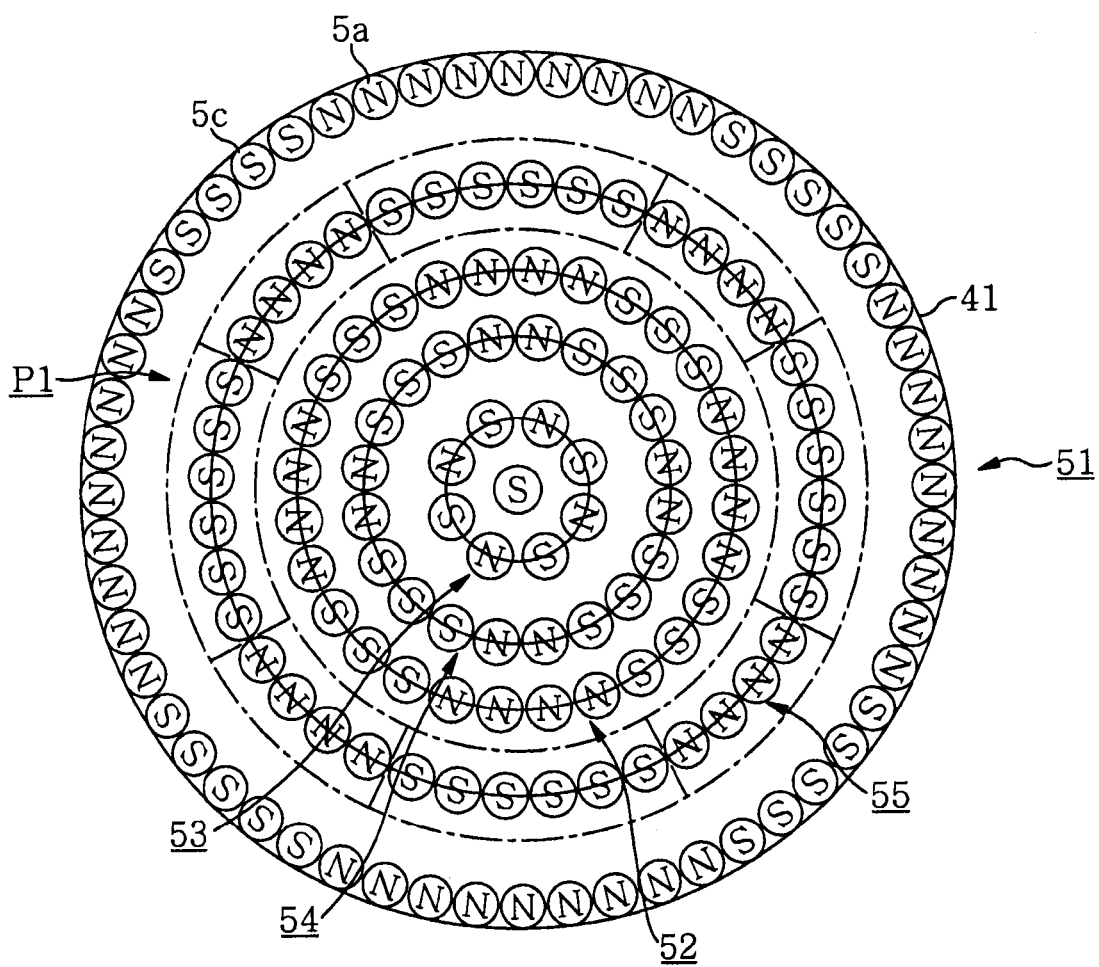
FIGS. 20 to 23 are plan views showing configuration examples of the magnet array body in the magnetron sputtering apparatus in accordance with the second embodiment.
Figure 21:
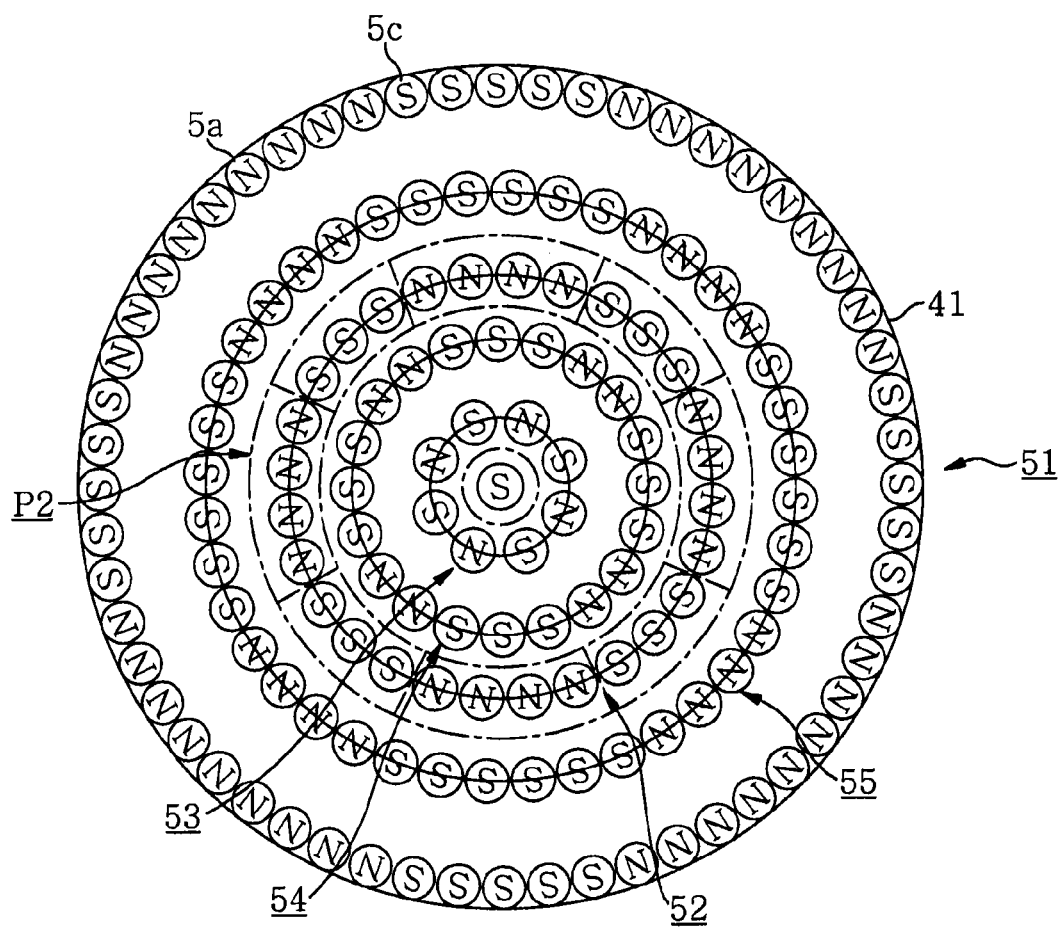
Figure 22:
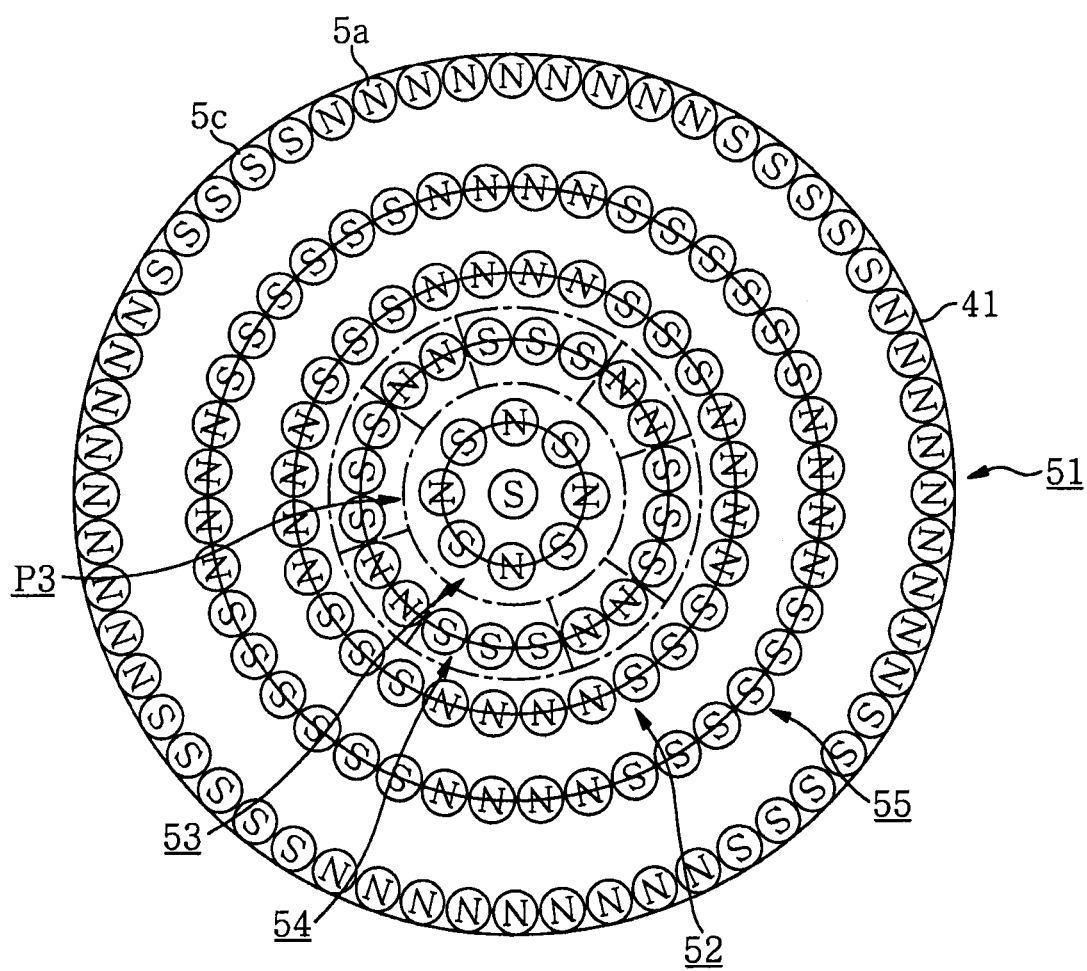
Figure 23:
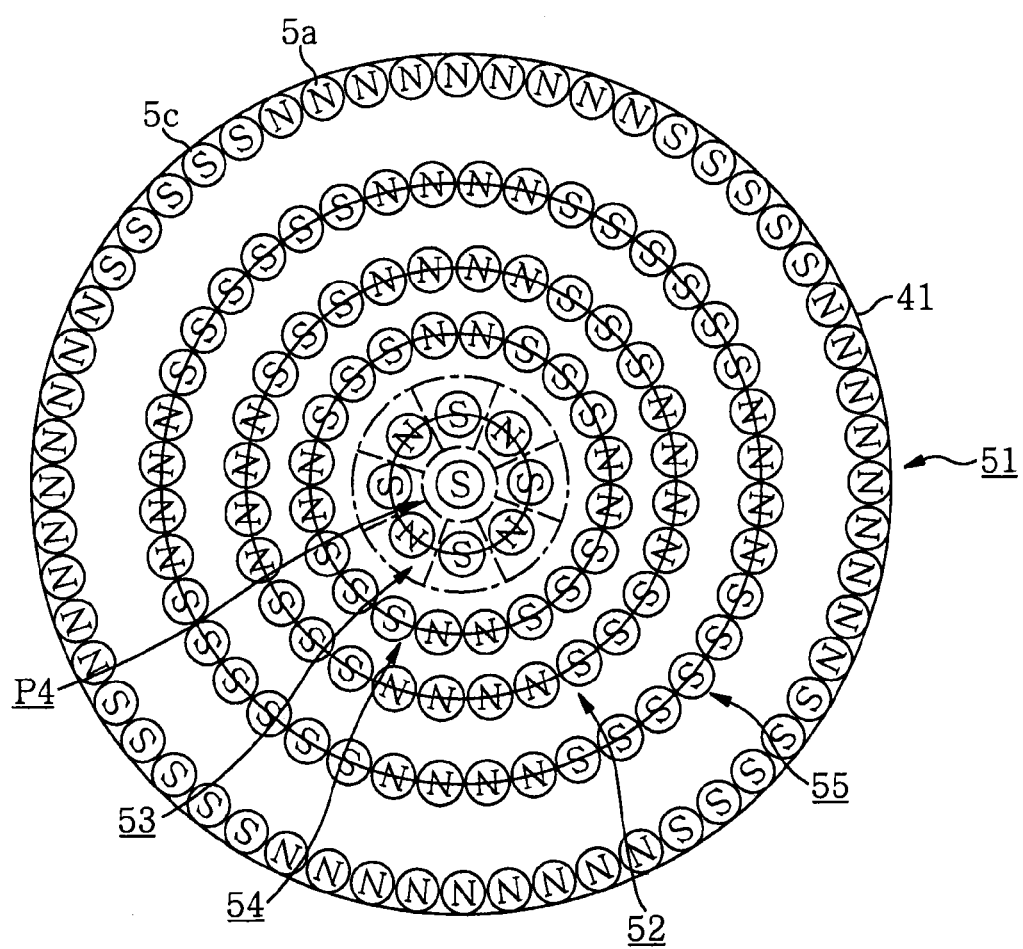
Figure 24A:
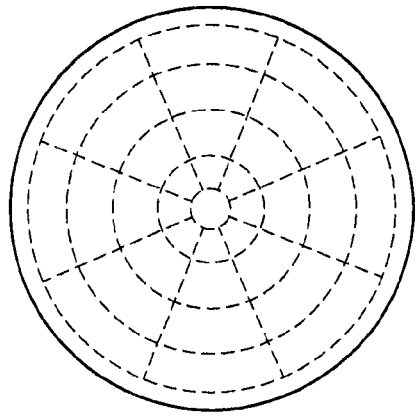
FIGS. 24A to 24E schematically show the configuration examples of the magnet array body in the magnetron sputtering apparatus in accordance with the second embodiment.
Figure 24B:
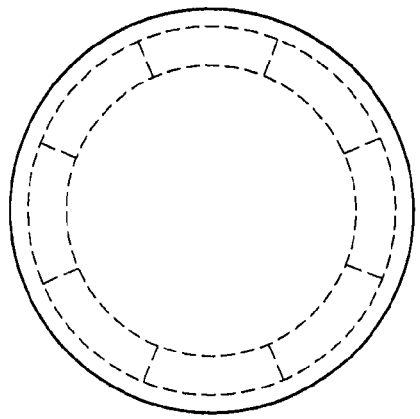
Figure 24C:
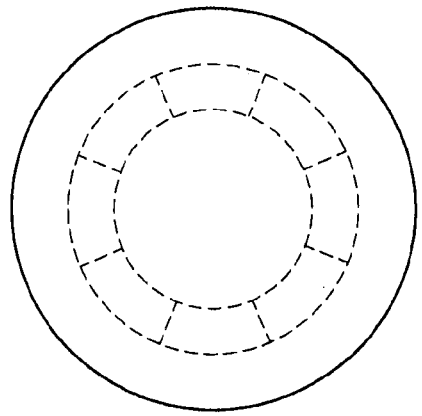
Figure 24D:
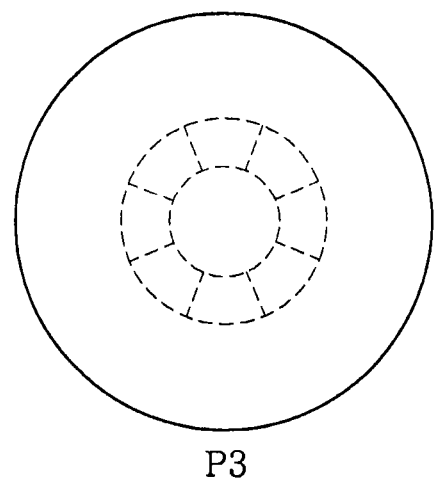
Figure 24E:
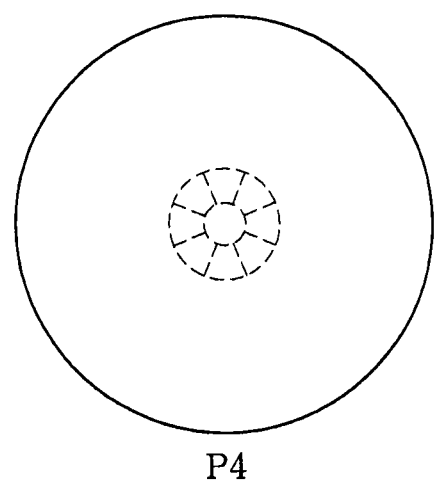

Taking the third main ring-shaped magnet array 53 as an example, as shown in FIG. 19, the magnet members 5 of the third ring-shaped magnet array 53 are fixed to the bottom surface of a ring body 80a. On the upper side on the ring body 80a, there is included the aforementioned tubular member 81a having a substantially cylindrical shape and provided with openings formed on opposite ends thereof.

There is also included one or more substantially bar-shaped support units 84a each of which has one end extending horizontally out from the outer peripheral end of the lower end of the tubular member 81a. The other side of each of the support units 84a which is vertically bent and extending downward is coupled to the upper surface of the ring body 80a. The support units 84a are provided at multiple points on the tubular member 81a in a circumferential direction thereof, whereby the tubular member 81a holds the third main ring-shaped magnet array 53 (ring body 80a).

An upper end portion of the tubular member 81a extends horizontally out in the circumferential direction thereof in a flange shape to serve as a flange portion 85a. In the opening 78, the flange portion 85a is engaged with an upper end portion of an inner peripheral side of the rotation plate 71 serving as the uppermost rotation plate (adjoining from the bottom side of the rotation plate 41) among the rotation plates 71 to 75, at a height position between the rotation plate 71 and the rotation plate 41. Between the flange portion 85a and the rotation plate 71, there is provided a ring-shaped bearing 86a along the circumference direction.

On the bottom surface side of the rotation plate 71, there is included a rotation unit 82a serving as a rotating unit for rotating a rotating shaft 87a around the vertical axis. There is also provided a ring-shaped belt 83a looped around the rotation shaft 87a and the tubular member 81a in order to unify the rotation of the rotation shaft 87a and the tubular member 81a. Therefore, even when the rotation plates 41 and 71 to 75 are eccentrically rotated, the tubular member 81a is configured to freely rotate around the vertical axis with respect to the rotation plate 71.

A tubular member 81b having a substantially same shape as that of the tubular member 81a is provided on the outer peripheral side of the tubular member 81a, and a flange portion 85b is provided on an upper end surface of the tubular member 81b to be engaged with the upper side of the inner peripheral side of the rotation plate 72. On the lower end of the tubular member 81b, there is provided the second auxiliary ring-shaped magnet array 54 via a ring body 80b. This second auxiliary ring-shaped magnet array 54 is configured to rotate around the vertical axis together with the tubular member 81b by using a rotating shaft 87b and a belt 83b by a rotation unit 82b provided on the bottom surface of the rotation plate 72.

Similarly, tubular members 81c, 81d and 81e are respectively provided in that order from the inner peripheral side towards the outer on the outer peripheral side of the tubular member 81b. These tubular members 81c to 81e are configured to be engaged with each of the corresponding rotation plates 73 to 75 and to freely rotate around the vertical axis provided by rotation units 82c to 82e that are disposed on the bottom surface of the respective rotation plates 73 to 75. Thus, each of the tubular members 81a to 81e is rotated around the vertical axis with respect to the rotation plate 41 (target 21).

In this second embodiment, the ring-shaped magnet arrays 51 to 55 and the S pole members 5c disposed on the inner side of the third main ring-shaped magnet array 53 have the same height positions of lower end sides thereof. For—a simpler description, FIG. 19 shows only one out of the five tubular members 81a to 81e of the tubular member 81. Also, the illumination of the ring bodies 80a to 80e is omitted in FIG. 17 described above as well as FIG. 20 to FIG. 23 to be described below.

In this second embodiment as shown in FIGS. 20 to 23, as the tubular members 81a to 81e are rotated around the vertical axis, the magnetic fields P1 to P4 are also freely formed. As shown in FIGS. 24A to 24E which schematically show the magnetic fields P1 to P4, in the case of the magnetic field P1, a line cusp magnetic field is formed between the first main ring-shaped magnet array 51 and the first auxiliary ring-shaped magnet array 55 in the circumferential direction while a direction of line cusp magnetic field is changed whenever the magnet poles switch. Similarly, a line cusp magnetic field is formed between the first auxiliary ring-shaped magnet array 55 and the second main ring-shaped magnet array 52 in the circumferential direction while a direction of line cusp magnetic field is changed whenever the magnet poles switch. Additionally, at the first auxiliary ring-shaped magnet array 55, a magnetic field is formed, extending in the radial direction of the rotation plate 41 at the borders of the N pole members 5a and the S pole members 5c, and cusp magnetic fields are formed around the magnets of each magnetic pole. Here, the cusp magnetic fields are combined, so that electrons drift around the magnets of each magnetic pole.

In the case of the magnetic field P2, between the first auxiliary ring-shaped magnet array 55 and the second main ring-shaped magnet array 52, and between the second main ring-shaped magnet array 52 and the second auxiliary ring-shaped magnet array 54, a magnetic field is formed in the circumferential direction while at the second main ring-shaped magnet array 52, a formed magnetic field is formed to extend in the radial direction of the rotation plate 41. In the case of the magnetic field P3, between the second main ring-shaped magnet array 52 and the second auxiliary ring-shaped magnet array 54, and between the second auxiliary ring-shaped magnet array 54 and the third main ring-shaped magnet array 53, a magnetic field is formed in the circumferential direction while at the second auxiliary ring-shaped magnet array 54, a formed magnetic field is formed to extend in the radial direction of the rotation plate 41.

Further, in the case of the magnetic field P4, between the second auxiliary ring-shaped magnet array 54 and the third main ring-shaped magnet array 53, and between the third main ring-shaped magnet array 53 and the S pole member 5c disposed on the inner side of the third main ring-shaped magnet array 53, a magnetic field is formed in the circumferential direction while at the third main ring-shaped magnet array 53, a formed magnetic field is formed to extend in the radial direction of the rotation plate 41.

As such, in the second embodiment, in addition to the magnetic fields formed in the circumferential direction, magnetic fields are additionally formed to extend in the radial direction of the rotation plate 41. As a result, generating uniform erosion over the surface of the target 21 is easier, and thus it is possible to improve the use efficiency of the target 21 and the film thickness uniformity.

Figure 25:
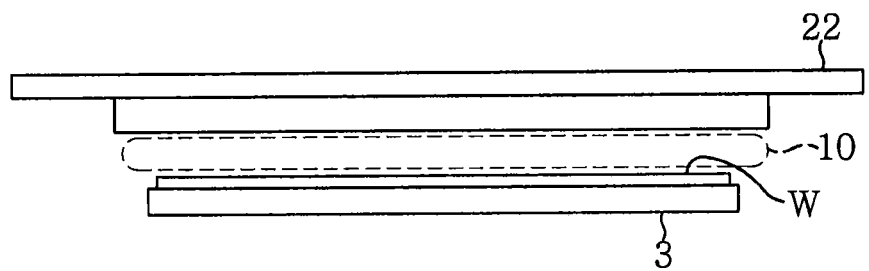
FIG. 25 is a side view partially showing the magnetron sputtering apparatus in accordance with the second embodiment to explain a combined magnetic field.
Figure 26:
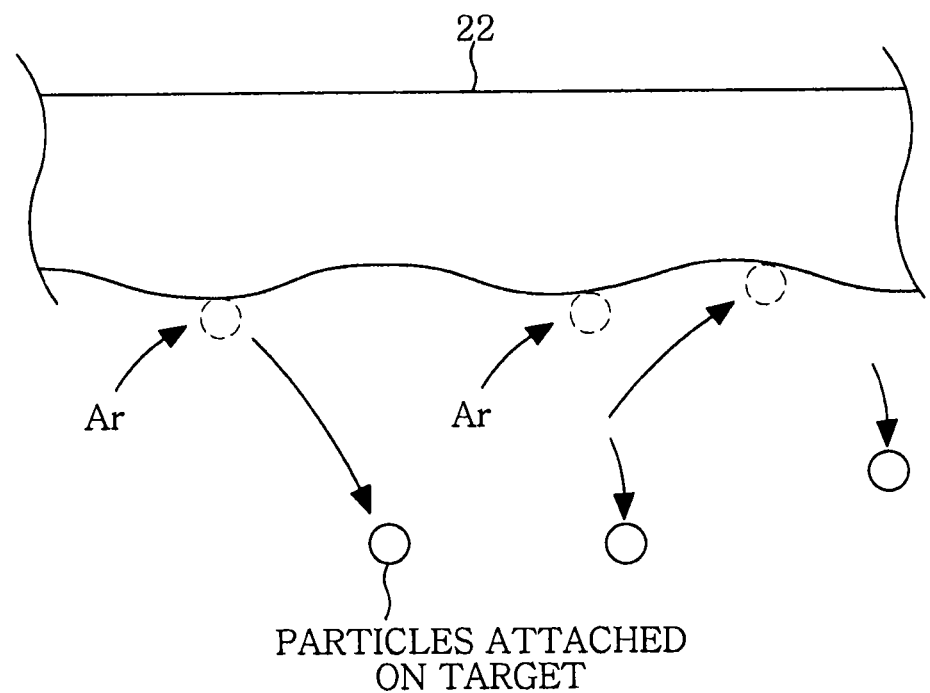
FIG. 26 is a side view showing how particles are generated in a base plate of the magnetron sputtering apparatus in accordance with the second embodiment.

Reference character "P0" shown in FIGS. 17 and 24A to 24E indicates a magnetic field formed by combining all the magnetic fields P1 to P4 as shown in FIG. 25. As described above, if the magnetic fields P1 to P4 are sequentially generated one by one to perform a sputtering process, particles that are generated by the sputtering process may be attached to the target 21, which may be a cause of particles. Therefore, during the sputtering process using any one of the magnetic fields P1 to P4, the erosion is preferably formed on the entire surface of the target 21 by using the magnetic field P0 to thereby remove the particles (deposited matters) attached to the target 21 as shown in FIG. 26.

In accordance with each of the above-mentioned embodiments, instead of a motor use configuration, electromagnets may be configured to be used as an operating unit that rotates the bipolar members 5b or each ring-shaped magnet array 51 to 55 around the vertical axis. Specifically, in the first embodiment, above each bipolar member 5b, there may be provided electromagnets (not shown) whose magnetic poles on the central and periphery side of the rotation plate 41 are freely switchable between S pole and N pole. As the electromagnets of the magnetic pole switch, the bipolar members 5b may be rotated around the vertical axis.

In the second embodiment, electromagnets (not shown) whose magnetic poles on the lower side are freely switchable between the S pole and N pole may be arranged above each ring-shaped magnet array 51 to 55 in the circumferential direction. As the electromagnets of the magnetic pole switch, the ring-shaped magnet arrays 51 to 55 may be rotated around the vertical axis.

Figure 27:
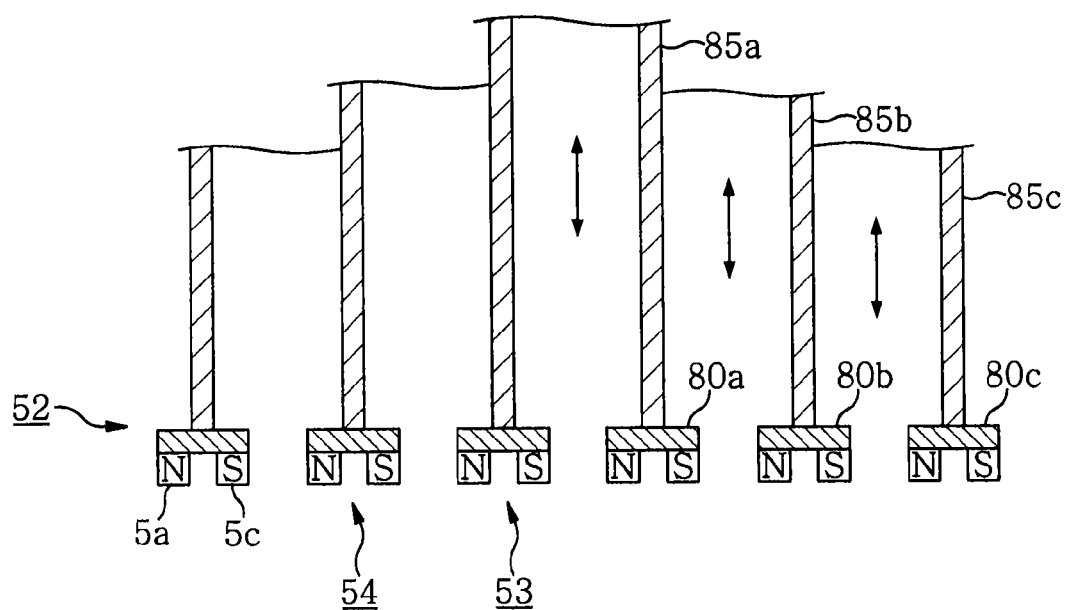
FIG. 27 is a longitudinal cross sectional view showing another example of the magnet array body included in the magnetron sputtering apparatus.
Figure 28:
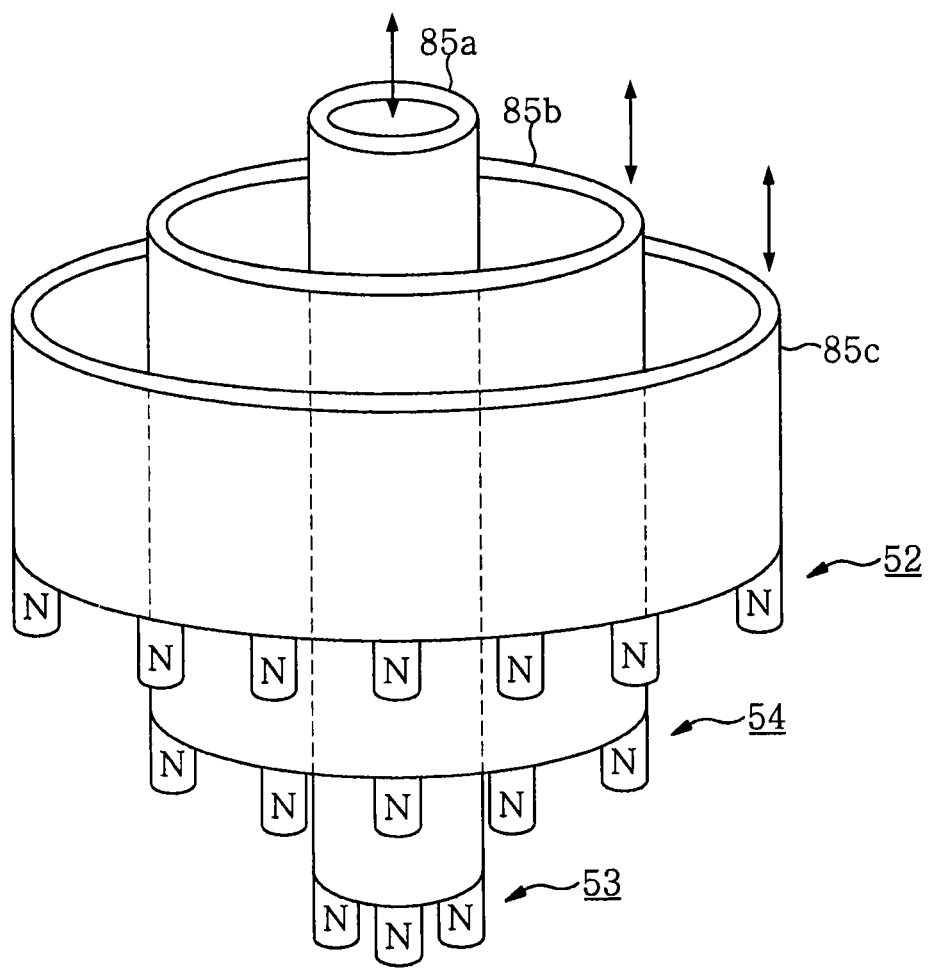
FIG. 28 is a partially enlarged perspective view showing the magnet array body.

In order to switch between the magnetic fields P1 to P4, as shown in the first embodiment, the bipolar members 5b of each ring-shaped magnet arrays 54 and 55 are rotated around the vertical axis and the second embodiment employs the technique to rotate each ring-shaped magnet array 51 to 55 around the vertical axis, but may also be configured as follows. For example, based on the configuration of the second embodiment, instead of the rotation unit 82a to 82e described above, a lifting unit (not shown) is provided as an operating unit to each of the rotation plates 71 to 75 to independently move each of the ring-shaped magnet arrays 51 to 55 up and down via the tubular members 81a to 81e as shown in FIG. 27 and FIG. 28. In FIG. 27 and FIG. 28, S pole members 5c and N pole members 5a are respectively disposed on the inner and outer periphery side of each of the ring-shaped magnet arrays 51 to 55 and the diagram pertaining to the first main ring-shaped magnet array 51 and the first auxiliary ring-shaped magnet array 55 is omitted. FIG. 28 also omits the description of the ring body 80.

In this case, to form any one magnetic field P, out of the magnetic fields P1 to P4, an inner and an outer annular body of the magnetic field are moved downward near the target 21 to equalize the height positions thereof. When inhibiting the formation of the magnetic field P, one of the inner and the outer annular body of the magnetic field are moved upward with respect to the other annular body in order to separate each other.

Figure 29:
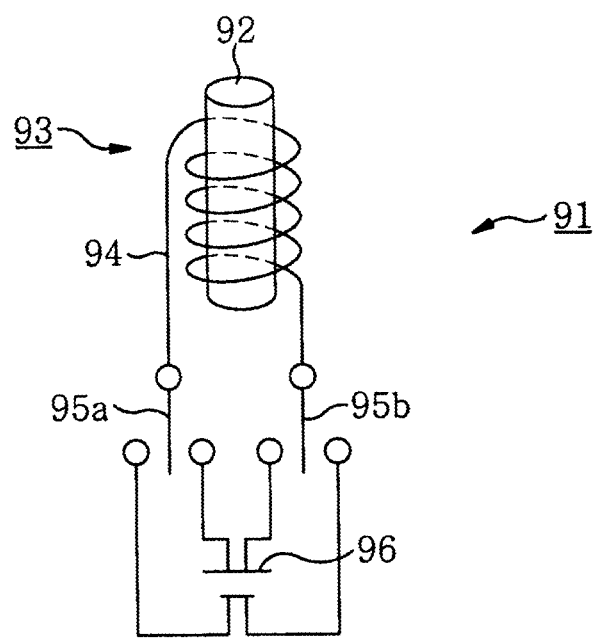
FIG. 29 schematically shows another type of the magnet members in accordance with the embodiments of the present invention.

As shown in FIG. 29, as for the magnet members 5 mentioned above, electromagnets 91 may be used instead of permanent magnets. In FIG. 29, reference numerals "92" and "93" respectively indicate a bar-shaped core material made of, for example, iron (Fe) or another ferromagnetic member and a coil coiled around the core material 92. This coil 93 is formed by coiling a conductive line 94 around the core material 92. For example, one end of the conductive line 94 is placed at a side of the core material 92 close to the rotation unit 43 and the other end thereof extends from a side of the core material 92 close to the target 21. The conductive line 94 is made of copper or the like, coated with, e.g., resin.

Switches 95a and 95b are respectively provided at one end and the other end of the conductive line 94 to serve as operating units. In the switch 95a, one (first) terminal and the other (second) terminal of a DC power supply 96 are arranged to be freely switchable. Similarly, in the switch 95b, the two terminals of the DC power supply 96 are arranged to be freely switchable. Both of the switches 95a and 95b respectively have access to the first terminal and the second terminal of the DC power supply 96 as a first access state or the second terminal and the first terminal thereof as a second access state. By switching between the access states of the switch 95a and 95b, it is possible to switch the poles of the electromagnet 91 on the side of the target 21. In addition, by blocking the accesses of all of the switches 95a and 95b to the DC power supply 96, it is possible to inhibit magnetic poles from being generated on the side of the target 21.

In the case when using the electromagnet 91, instead of rotating each of the bipolar members 5b of the auxiliary ring-shaped magnet arrays 54 and 55, or rotating each of the ring-shaped magnet arrays 51 to 55, the switches 95a and 95b can be switched. At this time, the electromagnets 91 and the permanent magnets (magnet members 5) may be combined.

In each of the above-mentioned embodiments, for example, of the two ring-shaped magnet arrays 51 and 55 that generate the magnetic field P1, the first auxiliary ring-shaped magnet array 55 was used to generate the magnetic field P2, but to generate the magnetic field P2, a ring-shaped magnet array may be arranged separately from the ring-shaped magnet arrays 51 and 55. That is, while an inner side ring-shaped magnetic pole array may be independently provided inside the main ring-shaped magnet array 51, an outer side ring-shaped magnetic pole array may be independently provided outside the second main ring-shaped magnet array 52.

In the examples described above, the first auxiliary ring-shaped magnet array 55 serves as the inner side ring-shaped magnetic pole array of the magnetic pole array set for forming the magnetic field P1 and the outer side ring-shaped magnetic pole array of the magnetic pole array set for forming the magnetic field P2, simultaneously. Additionally, likewise as above, in each case of the magnetic fields P2 to P4, two ring-shaped magnetic pole arrays may be provided independently.

In the case when ring-shaped magnet arrays are independently provided to generate each of the magnetic fields P1 to P4, in the first embodiment described above, the magnetic poles of the main ring-shaped magnet arrays 51 to 53 on the side of the target 21 may be configured differently from each other. As shown in FIG. 27 and FIG. 28 described above, the magnetic poles of the inner side ring-shaped magnetic pole array of one magnetic pole array set and the magnetic pole of the outer side ring-shaped magnetic pole array of another magnetic pole array set adjacent thereto, is configured to be vertically movable as a single unit, via the cylindrical member 81. Also, in addition to the aforementioned magnetic fields P1 to P4, another ring-shaped magnet field may be formed on the outer periphery side of the magnetic field P1 and/or the inner periphery side of the magnetic field P4.

In the above-mentioned embodiments, the power value (power density) of each of the magnetic fields P1 to P4 applied to the target 21 is controlled to obtain film thickness uniformity on the surface of the wafer w. However, instead of the power value or in addition to the power value, the value of a bias power may be controlled, the bias power being supplied from the high frequency power unit 31 to the mounting table 3.

Here, during the film forming process, it becomes difficult to generate a discharge when the distance h between the target 21 and the wafer w is too narrow, and thus a distance set at 10 mm or more is desirable.

The materials of the target 21, in place of titanium, may include conductors such as tungsten (W), copper, aluminum, titanium nitride, tantalum (Ta), tantalum nitride (Ta $N_x$), ruthenium (Ru), hafnium (Hf), molybdenum (Mo) and the like, or insulators such as silicon oxide (Si—O), silicon nitride (Si—N), titanium oxide (Ti $O_2$), zinc oxide (Zn O), indium oxide (In 203) and the like. In the case where the reactive sputtering film is formed by using the target 21, a reactant gas that generates active species reacting with the target 21 to is used. When the target 21 made of an insulator is used, a high-frequency voltage is applied to the target 21. A high-frequency voltage may also be applied to the target 21 made of a conductor.

In addition to disposing the magnet array body 4 in such a way that the outer circumference of the magnet array body 4 is concentric to the outer circumference of the wafer w on the mounting table 3, the magnet array body 4 may be configured to rotate around the vertical axis that goes through the center of the magnet array body 4. Also, even though multiple magnet members 5 of the ring-shaped magnet array 51 to 55 use the circumferential alignment configuration in the aforementioned embodiments, an annular magnet unit (formed of multiple magnet members 5 forming one ring-shaped magnet array which are annularly formed as a single unit) may be used while each of the outer and inner periphery surfaces thereof is formed in a ring shape in the circumferential direction of the rotation plate 41. Specifically, the inner or outer whole part of each ring-shaped magnet arrays 51 to 55 may form one magnetic pole.

Instead of nitride gas, a nitrogen oxide ($NO_x$) gas may be used as a reactant gas which is supplied to the vacuum chamber 2 together with argon gas. The substrate to be subjected to the sputtering process in the magnetron sputtering apparatus of the present embodiments includes liquid crystal, glass solar cells, plastic and the like in addition to semiconductor wafers. In these cases, polygonal substrates may be used. Further, in the present embodiments, the reactant sputtering film formation including the sputtering and the reaction of the target 21 is carried out, but the reactant gas (nitride gas) does not have to be used and instead, ions of argon gas may be used to sputter the film formation.

The terms "first," "second," "third", "main," and "auxiliary" of the ring-shaped magnet arrays 51 to 55 described above are used in convenience, for example, the first main ring-shaped magnet array 51, the second main ring-shaped magnet array 52 and the third main ring-shaped magnet array 53 are disposed in this order starting from the center going towards the outer periphery of the rotation plate 41, and the main ring-shaped magnet array and the auxiliary ring-shaped magnet array may be replaced with each other.

While the invention has been shown and described with respect to the embodiments, it will be understood by those skilled in the art that various changes and modifications may be made without departing from the scope of the invention as defined in the following claims.

What is claimed is:

1. A magnetron sputtering apparatus in which a target is disposed opposite to a substrate to be processed mounted in a vacuum chamber and magnet members are disposed on a back surface of the target, the apparatus comprising:
    a power supply unit configured to apply a voltage to the target;
    a plurality of magnetic pole array sets, each of which includes an outer ring-shaped magnetic pole array formed of magnetic poles arranged in a circumferential direction of the substrate and an inner ring-shaped magnetic pole array formed of magnetic poles arranged in the circumferential direction of the substrate inwardly of the outer ring-shaped magnetic pole array, arranged concentrically with each other, each of the magnetic pole array sets serving to generate a cusp magnetic field between the outer and the inner ring-shaped magnetic pole array and allow electrons to drift in the circumferential direction of the substrate;
    an operating unit configured to move the inner and/or the outer ring-shaped magnetic pole array of each of the magnetic pole array sets to temporally switch the magnetic pole array set which generates the cusp magnetic field; and
    a rotation unit configured to rotate the magnetic pole array sets along the circumferential direction of the substrate.

2. The apparatus of claim 1, wherein a gas supply path is provided in a processing space between the target and the substrate to supply a reactant gas for generating active species that reacts with the target and a plasma generating gas that is needed to activate the reactant gas.

3. The apparatus of claim 1, wherein a distance between the target and the substrate is set to 30 mm or lower during a film forming process.

4. The apparatus of claim 1, wherein the magnetic poles of the inner ring-shaped magnetic pole array of one of the magnetic pole array sets also serves as the magnetic poles of the outer ring-shaped magnetic pole array of the magnetic pole array set inwardly adjacent thereto,
    the corresponding magnetic poles are formed of N-pole and/or S-pole arranged side by side on each of the magnet members arranged along the circumferential direction of the substrate, each of the magnet members being independently arranged to be rotatable about an axis perpendicular to the substrate, and
    the operating unit changes the orientation of each of the magnet members to temporally switch the magnetic pole array set which generates the cusp magnetic field between the corresponding magnetic pole array sets.

5. The apparatus of claim 1, wherein the operating unit serves to rotate at least one of the outer and the inner ring-shaped magnetic pole array around an axis extending through the center of the corresponding ring-shaped magnetic pole array.

6. The apparatus of claim 1, wherein the magnetic poles of the inner ring-shaped magnetic pole array of one of the magnetic pole array sets also serves as the magnetic poles of the outer ring-shaped magnetic pole array of the magnetic pole array set inwardly adjacent thereto.

7. The apparatus of claim 1, wherein a power that is supplied from the power supply unit to the target is set to be smaller in a case where the magnetic pole array set arranged at an inner side generates the cusp magnetic field than in a case where the magnetic pole array set arranged at an outer side generates the cusp magnetic field to obtain an in-plane uniform composition of a thin film formed on the substrate by the sputtering of the target.

8. The apparatus of claim 1, wherein a time period for which a power is applied to the target is controlled individually for each of the magnetic pole array sets to obtain an in-plane uniform thickness of a thin film formed on the substrate by the sputtering of the target.

9. A method for performing a sputtering film forming process on a substrate to be processed by using the magnetron sputtering apparatus of claim 1, the method comprising:
   applying a voltage from a power supply unit to the substrate; and
   performing a film forming process on the substrate by the sputtering of the target by generating a cusp magnetic field by the magnetic pole array sets in such a way that electrons drift in a circumferential direction of the substrate,
   wherein the performing a film forming process includes:
      generating an annular cusp magnetic field in the circumferential direction of the substrate at one of a peripheral portion and a central portion of the substrate; and then
      generating an annular cusp magnetic field in the circumferential direction of the substrate at the other of the peripheral portion and the central portion of the substrate.

10. The method of claim 9, wherein the performing a film forming process includes supplying a reactant gas for generating active species that react with the target and a plasma generating gas that is needed to activate the reactant gas to the processing space between the target and the substrate.

11. The method of claim 9, wherein, the performing a film forming process includes setting a distance between the target and the substrate to 30 mm or lower.

12. The method of claim 10, wherein, the performing a film forming process includes setting a distance between the target and the substrate to 30 mm or lower.

\* \* \* \* \*